United States Patent
Lin et al.

(10) Patent No.: US 12,027,624 B2
(45) Date of Patent: Jul. 2, 2024

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Shih-Yao Lin, New Taipei (TW); Hsiao Wen Lee, Hsinchu (TW); Li-Jung Kuo, Hsinchu (TW); Chen-Ping Chen, Toucheng Township (TW); Ming-Ching Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 7 days.

(21) Appl. No.: 18/066,777

(22) Filed: Dec. 15, 2022

(65) Prior Publication Data

US 2023/0119370 A1    Apr. 20, 2023

Related U.S. Application Data

(62) Division of application No. 17/230,414, filed on Apr. 14, 2021, now Pat. No. 11,552,195.

(51) Int. Cl.
*H01L 29/76* (2006.01)
*H01L 21/8234* (2006.01)
(Continued)

(52) U.S. Cl.
CPC .. *H01L 29/7851* (2013.01); *H01L 21/823431* (2013.01); *H01L 21/823481* (2013.01); *H01L 29/0649* (2013.01); *H01L 29/66795* (2013.01)

(58) Field of Classification Search
CPC ......... H01L 29/7851; H01L 21/823431; H01L 21/823481; H01L 29/0649; H01L 29/66795; H01L 21/76229; H01L 29/42392; H01L 29/775; H01L 29/78696; H01L 27/0886
(Continued)

(56) References Cited

U.S. PATENT DOCUMENTS 8,916,939 B2    12/2014    Yu et al.
2008/0061341 A1*    3/2008    Lung ...................... H10B 63/30
257/532

(Continued)

*Primary Examiner* — Theresa T Doan
(74) *Attorney, Agent, or Firm* — FOLEY & LARDNER LLP

(57) ABSTRACT

A semiconductor device in a first area includes first non-planar semiconductor structures separated with a first distance, and a first isolation region including a first layer and a second layer that collectively embed a lower portion of each of the first non-planar semiconductor structures. At least one of the first layer or second layer of the first isolation region is in a cured state. The semiconductor device in a second area includes second non-planar semiconductor structures separated with a second distance, and a second isolation region including a first layer and a second layer that collectively embed a lower portion of each of the second non-planar semiconductor structures. At least one of the first or second layer of the second isolation region is in a cured state.

20 Claims, 20 Drawing Sheets

(51) Int. Cl.
    *H01L 29/06*          (2006.01)
    *H01L 29/66*          (2006.01)
    *H01L 29/78*          (2006.01)
    *H01L 29/94*          (2006.01)
    *H01L 31/062*        (2012.01)

(58) Field of Classification Search
    USPC .......................................................... 257/288
    See application file for complete search history.

(56) References Cited

U.S. PATENT DOCUMENTS

2008/0254617 A1* 10/2008 Adetutu ............ H01L 23/53238
                                                                                                     438/643
2018/0350800 A1   12/2018 Chang et al.

* cited by examiner

SEMICONDUCTOR DEVICES AND METHODS OF MANUFACTURING THEREOF

CROSS-REFERENCE TO RELATED APPLICATION

This application is a divisional application of U.S. Utility application Ser. No. 17/230,414, filed Apr. 14, 2021, titled "SEMICONDUCTOR DEVICES AND METHODS OF MANUFACTURING THEREOF," the entire contents of which are incorporated herein by reference for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
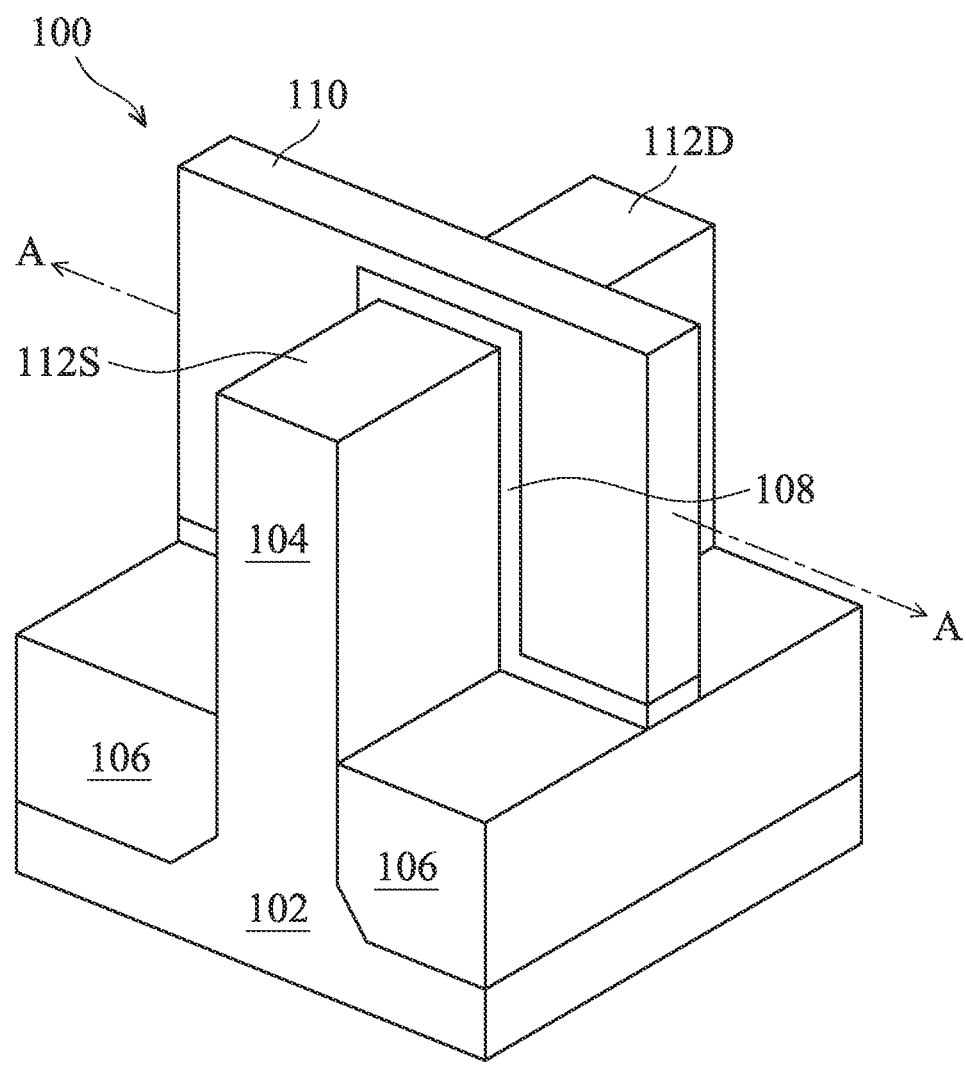
FIG. 1 illustrates a perspective view of a fin-based field-effect-transistor (FinFET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, an integrated circuit includes various types of transistors formed on a substrate. Some of the transistors are configured to conduct a higher current, while some of the transistors are configured to conduct a lower current. For the transistor that can generate the higher current, its corresponding active gate structure can straddle a number of channels that may be disposed more closer to each other (e.g., in a higher density). For the transistor that can generate the lower current, its corresponding active gate structure can straddle a number of channels that may be disposed less closer to each other (e.g., in a lower density). After defining the channels, an insulation material may be disposed between the channels to form a shallow trench isolation (STI) region/structure such as to expose respective upper portions of the channels. Such an insulation material can be further densified by various curing techniques.

However, due to the different densities of channels, the portion of the insulation material being densified may have different thickness (or heights). This can cause the following etching back process, which is applied on the insulation material that has a mixture of cured and uncured states, to form the STI structure in different heights between the channels in different densities. For example, the STI structure formed over the high density channels may have a lower height (i.e., exposing a higher height of the channels), and the STI structure formed over the low density channels may have a lower height (i.e., exposing a lower height of the channels). Consequently, active gate structures later formed over such channels have different gate heights, which may disadvantageously affect performance of some transistors that have the lower gate heights.

Embodiments of the present disclosure are discussed in the context of forming a non-planar field-effect-transistor (FET) device (e.g., a fin-based FET device, a gate-all-around (GAA) FET device, etc.), and in particular, in the context of forming STI structures for a number of non-planar transistors. Unlike the existing technologies that cures only the upper portion of an insulation material, the present disclosure provides various embodiments of methods to form at least a first insulation layer/film in a cured state below a second insulation layer/film that is later converted into a cured state. As such, a thick enough cured insulation material (e.g., constituted by a stack of the first and second insulation layers) can be formed between the channels in different densities, which allows the later etching back process to have a unified etching rate on such a thick, cured insulation material. Consequently, portions of the channels, exposed by the STI structures, can be controlled to have a similar height, which can allow the later formed active gate structures to have a similar gate height.

FIG. 1 illustrates a perspective view of an example FinFET device 100, in accordance with various embodiments. The FinFET device 100 includes a substrate 102 and a fin 104 protruding above the substrate 102. Isolation regions 106 are formed on opposing sides of the fin 104, with the fin 104 protruding above the isolation regions 106. A gate dielectric 108 is along sidewalls and over a top surface of the fin 104, and a gate 110 is over the gate dielectric 108. Source region 112S and drain region 112D are in (or extended from) the fin 104 and on opposing sides of the gate dielectric 108 and the gate 110. FIG. 1 is provided as a reference to illustrate a number of cross-sections in subsequent figures. For example, cross-section A-A extends along a longitudinal axis of the gate 110. Subsequent figures refer to this reference cross-section for clarity.

Figure 2:
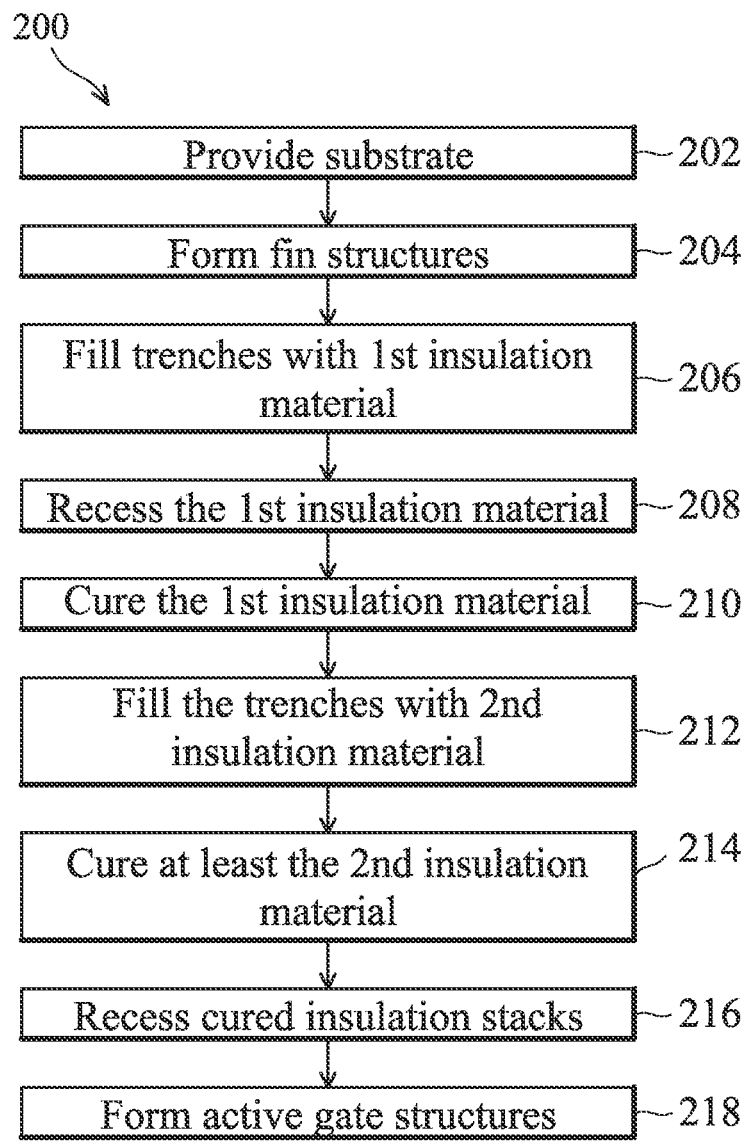
FIG. 2 illustrates a flow chart of an example method for making a FinFET device, in accordance with some embodiments.

FIG. 2 illustrates a flowchart of a method 200 to form a non-planar transistor device, according to one or more embodiments of the present disclosure. For example, at least some of the operations (or steps) of the method 200 can be used to form a FinFET device (e.g., FinFET device 100), a nanosheet transistor device, a nanowire transistor device, a vertical transistor device, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional views of an example FinFET device at various fabrication stages as shown in FIGS. 3, 4, 5, 6, 7, 8, 9, 10, and 11, respectively, which will be discussed in further detail below.

In brief overview, the method 200 starts with operation 202 of providing a substrate. The method 200 continues to operation 204 of forming a number of semiconductor fin structures. The method 200 continues to operation 206 of filling trenches between the semiconductor fin structures with a first insulation material. The method 200 continues to operation 208 of recessing the first insulation material. The method 200 continues to operation 210 of curing the first insulation material. The method 200 continues to operation 212 of filling the trenches with a second insulation material. The method 200 continues to operation 214 of curing at least the second insulation material. The method 200 continues to operation 216 of recessing a cured insulation stack. The method 200 continues to operation 218 of forming active gate structures.

As mentioned above, FIGS. 3-11 each illustrate, in a cross-sectional view, a portion of a transistor device 300 at various fabrication stages of the method 200 of FIG. 2. The transistor device 300 is similar to the FinFET device 100 shown in FIG. 1, but with multiple gate structures and multiple fins. Although FIGS. 3-11 illustrate the transistor device 300, it is understood the transistor device 300 may include a number of other devices such as inductors, fuses, capacitors, coils, etc., which are not shown in FIGS. 3-11, for purposes of clarity of illustration.

Figure 3:
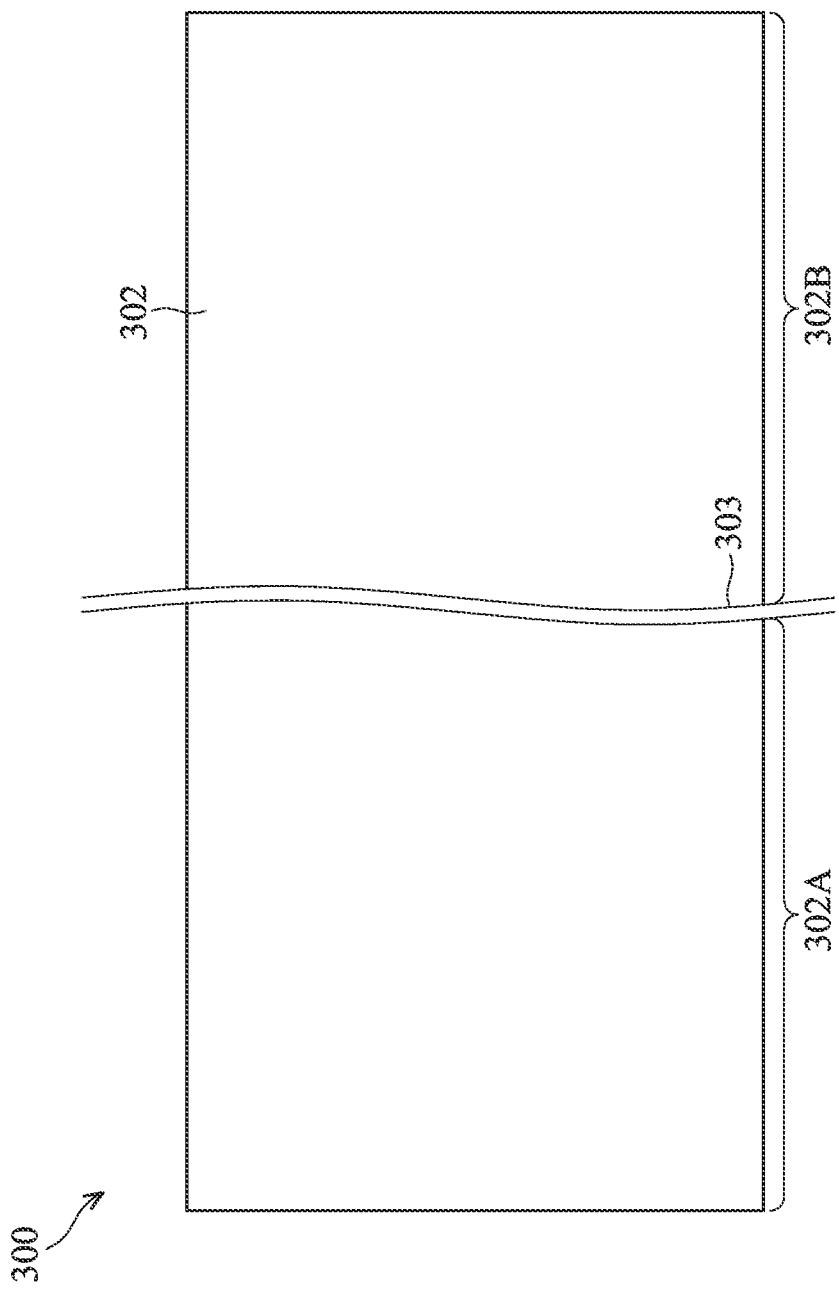
FIGS. 3, 4, 5, 6, 7, 8, 9, 10, and 11 illustrate cross-sectional views of an example FinFET device (or a portion of the example FinFET device) during various fabrication stages, made by the method of FIG. 2, in accordance with some embodiments.

Corresponding to operation 202 of FIG. 2, FIG. 3 is a cross-sectional view of the transistor device 300 including a semiconductor substrate 302 at one of the various stages of fabrication, in some embodiments. The cross-sectional view of the transistor device 300 in FIG. 3 is cut along the lengthwise direction of a gate structure, e.g., cross-section A-A (as indicated in FIG. 1).

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the transistor device 300 can include areas 302A and 302B. The area 302A can be configured to form a number of first channels (e.g., a semiconductor fin structure, a stack of nanostructures/channel layers) in a relatively higher density; and the area 302B can be configured to form a number of second channels (e.g., a semiconductor fin structure, a stack of nanostructures/channel layers) in a relatively lower density. The areas 302A and 302B may sometimes be referred to as "high density area 302A" and "low density area 302B," respectively. As shown in FIG. 3 (and the following figures), the high density area 302A and low density area 302B are separated from each other by a symbolic divider 303, which can include additional features/components/devices that are omitted for simplicity. It should be appreciated that some of the operations of the method 200 may be concurrently performed in the areas 302A and 302B. For purposes of illustration, some of the feature(s) formed in the areas 302A and 302B are hereinafter shown in the same figure that corresponds to one of the operations of the method 200.

Figure 4:
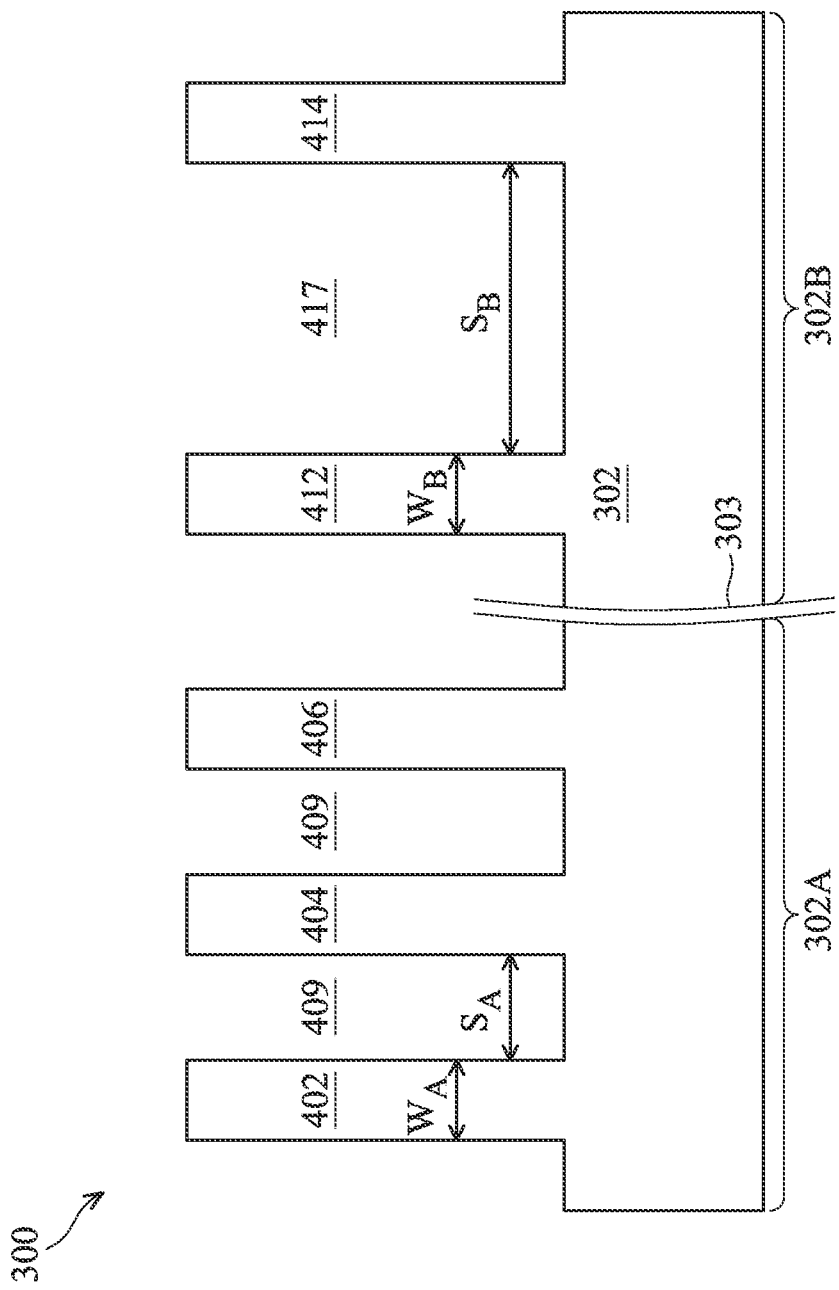

Corresponding to operation 204 of FIG. 2, FIG. 4 is a cross-sectional view of the transistor device 300 including semiconductor fin structures 402, 404, and 406 in the area 302A and semiconductor fin structures 412 and 414 in the area 302B at one of the various stages of fabrication, in some embodiments. The cross-sectional view of FIG. 4 is cut along the lengthwise direction of an active/dummy gate structure of the transistor device 300 (e.g., cross-section A-A indicated in FIG. 1).

The term "semiconductor fin structure" may refer to a non-planar semiconductor structure that vertically protrudes from the top surface of a planar surface. Although in the illustrated example of FIG. 4, the semiconductor fin structures 402 to 406 and 412 to 414 are each formed as a continuous one-piece structure protruding from a top surface of the substrate 302, it should be understood that the semiconductor fin structures 402 to 406 and 412 to 414 may each be formed as a structure protruding from the top surface, while remaining within the scope of the present disclosure. For example, the semiconductor fin structures 402 to 406 and 412 to 414 can each include a number of first semiconductor layers and a number of second semiconductor layers alternately stacked on top of one another.

In the high density area 302A, the semiconductor fin structures 402-406, each of which has a width, WA, are laterally separated from one another with a first distance (or spacing), SA; and in the low density area 302B, the semiconductor fin structures 412-414, each of which has a width, WB, are laterally separated from one another with a second distance (spacing), SB. The widths WA and WB may each range between about 3 nanometers (nm) and about 200 nm. The spacings SA and SB may each range between about 3 nm and about 1000 nm. Although three and two semiconductor fin structures are shown in the area 302A and area 302B, respectively, it should be appreciated that the transistor device 300 can include any number of semiconductor fin structures in each of the areas 302A and 302B, while remaining within the scope of the present disclosure.

A density of the semiconductor fin structures in the area 302A, $D_A$, can be characterized by the following formula:

$$\sum W_A / \sum W_A + \sum S_A$$

and a density of the semiconductor fin structures in the area 302B, $D_B$, can be characterized by the following formula:

$$\sum W_B / \sum W_B + \sum S_B.$$

In some embodiments, $D_A$ may be substantially greater than $D_B$. In some embodiments, a ratio of $D_A$ to $D_B$ may be at least 1.05.

The semiconductor fin structures 402 to 406 and 412 to 414 are formed by patterning the substrate 302 using, for example, photolithography and etching techniques. For example, a mask layer, such as a pad oxide layer and an overlying pad nitride layer, is formed over the substrate 302. The pad oxide layer may be a thin film comprising silicon oxide formed, for example, using a thermal oxidation process. The pad oxide layer may act as an adhesion layer between the substrate 302 and the overlying pad nitride layer. In some embodiments, the pad nitride layer is formed of silicon nitride, silicon oxynitride, silicon carbonitride, the like, or combinations thereof. It should be understood that the pad nitride layer can include a multilayer structure (e.g., a layer of silicon oxide on a layer of silicon nitride). The pad nitride layer may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer and pad nitride layer to form a patterned mask.

The patterned mask is subsequently used to pattern exposed portions of the substrate 302 to form trenches (or openings) 409 and 417 between adjacent ones of the semiconductor fin structures 402 to 406 and 412 to 414, as illustrated in FIG. 4. When multiple semiconductor fin structures are formed, such a trench may be disposed between any adjacent ones of the semiconductor fin structures. In some embodiments, the semiconductor fin structures 402 to 406 and 412 to 414 are formed by etching trenches 409 and 417 in the substrate 302 using, for example, reactive ion etch (RIE), neutral beam etch (NBE), the like, or combinations thereof. The etch may be anisotropic. In some embodiments, the trenches 409 and 417 may be strips (viewed from the top) parallel to each other, and closely spaced with respect to each other. In some embodiments, the trenches 409 and 417 may be continuous and surround the semiconductor fin structures.

The semiconductor fin structures 402 to 406 and 412 to 414 may be patterned by any suitable method. For example, the semiconductor fin structures 402 to 406 and 412 to 414 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin.

FIGS. 3 and 4 illustrate an embodiment of forming the semiconductor fin structures 402 to 406 and 412 to 414, but a fin structure may be formed in various different processes. For example, a top portion of the substrate 302 may be replaced by a suitable material, such as an epitaxial material suitable for an intended type (e.g., N-type or P-type) of semiconductor devices to be formed. Thereafter, the substrate 302, with epitaxial material on top, is patterned to form the semiconductor fin structures 402 to 406 and 412 to 414 that include the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form one or more fin structures.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form one or more fin structures.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the semiconductor fin structures 404A-D may include silicon germanium ($Si_xGe_{1-x}$, where x can be between 0 and 1), silicon carbide, pure or pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
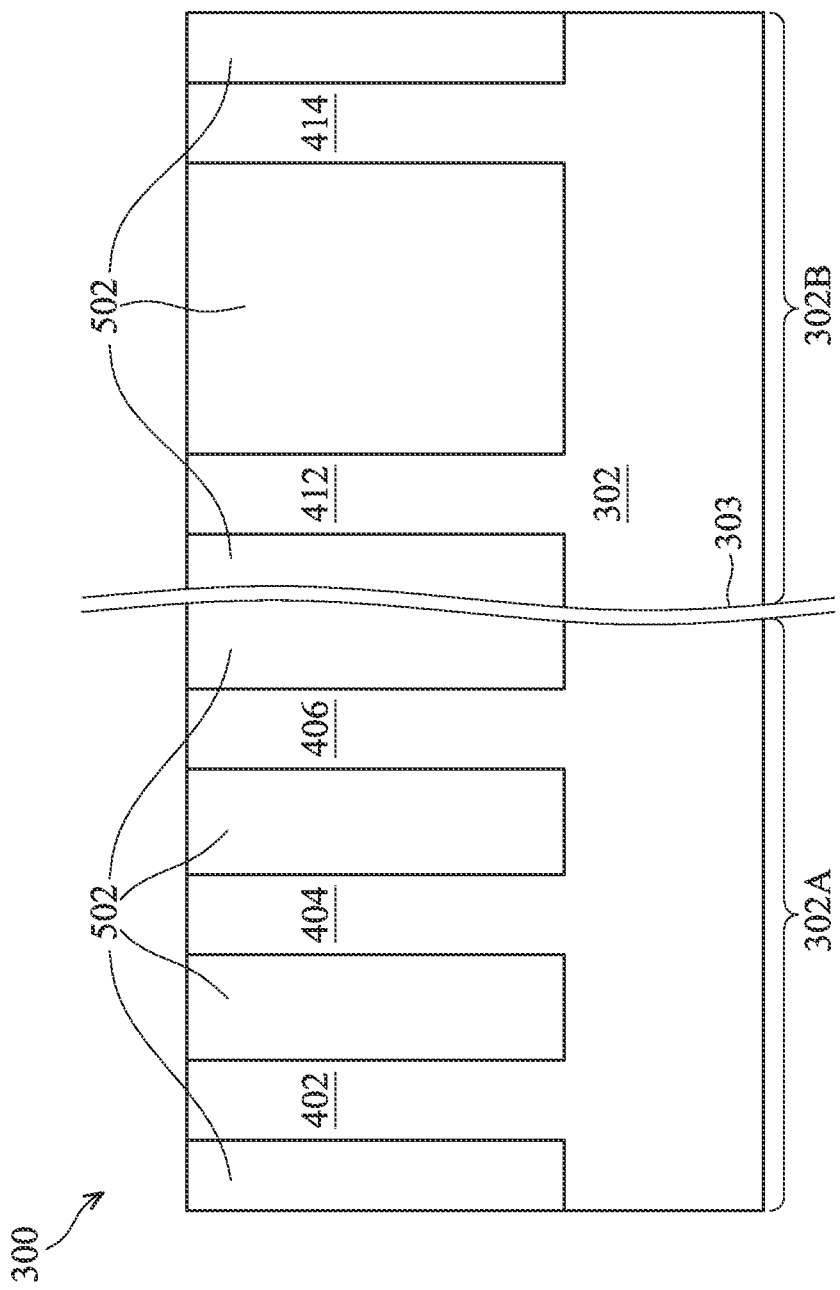

Corresponding to operation 206 of FIG. 2, FIG. 5 is a cross-sectional view of the transistor device 300 including an insulation (isolation) material 502 at least partially filling the trenches 409 and 417 (FIG. 4) at one of the various stages of fabrication, in some embodiments. The cross-sectional view of FIG. 5 is cut along the lengthwise direction of an active/dummy gate structure of the transistor device 300 (e.g., cross-section A-A indicated in FIG. 1).

The insulation material 502 can be formed as a flowable insulation layer, hereinafter "flowable insulation layer 502." For example, the flowable insulation layer 502 can overfill the trenches 409 and 417 and the semiconductor fin structures 402-406 and 412-414, optionally followed by a chemical mechanical polishing (CMP) process. In another example, the flowable insulation layer 502 can partially fill the trenches 409 and 417 (i.e., with a certain amount of upper portions of the semiconductor fin structures 402-406 and 412-414 protruding from the flowable insulation layer 502). Further, it should be understood that the trenches 409 and 417 can be filled with the insulation material 502 that is formed through a deposition-based process, for example, a chemical vapor deposition (CVD) process, a low-pressure chemical vapor deposition (LPCVD) process, a plasma enhanced chemical vapor deposition (PECVD) process, or the like, while remaining within the scope of the present disclosure.

The flowable insulation layer 502 can include a flowable dielectric material such as, for example, a silicon oxide material, a silicon nitride material, or combinations thereof. The flowable insulation layer 502 is formed by using a spin on dielectric (SOD) such as a silicate, a siloxane, a methyl SilsesQuioxane (MSQ), a hydrogen SisesQuioxane (HSQ), an MSQ/HSQ, a perhydrosilazane (TCPS) or a perhydropolysilazane (PSZ). Alternatively, the flowable insulation layer 502 can be formed by using a low temperature plasma chemical vapor deposition at a temperature less than about 100° C. under a pressure ranging from about 100 mTorr to about 10 Torr. A reaction source uses a gaseous environment containing $Si_3H_9N$ and $NH_3$. In one embodiment, the flow rates of $Si_3H_9N$ and $NH_3$ should be in the range of about 100 standard cubic centimeters per minute (sccm) to about 1000 sccm, and of about 100 sccm to about 2000 sccm, respectively. The flowable insulation layer 502 can fill the narrow and deep gaps and prevent voids and discontinuities in an STI structure.

In accordance with various embodiments, an insulation layer as-formed (e.g., through a flowable process, a deposition process, etc.) may be in an uncured state. When in the uncured state, the insulation layer may have less or nearly no bonding between its molecules/atoms. In one or more later processes (which will be discussed in further detail below), such an uncured insulation layer may be cured or otherwise converted to be in a cured state, which can cause the molecules/atoms to bond to one another. Alternatively stated, the uncured insulation layer can be densified to become the cured insulation layer.

Figure 6:
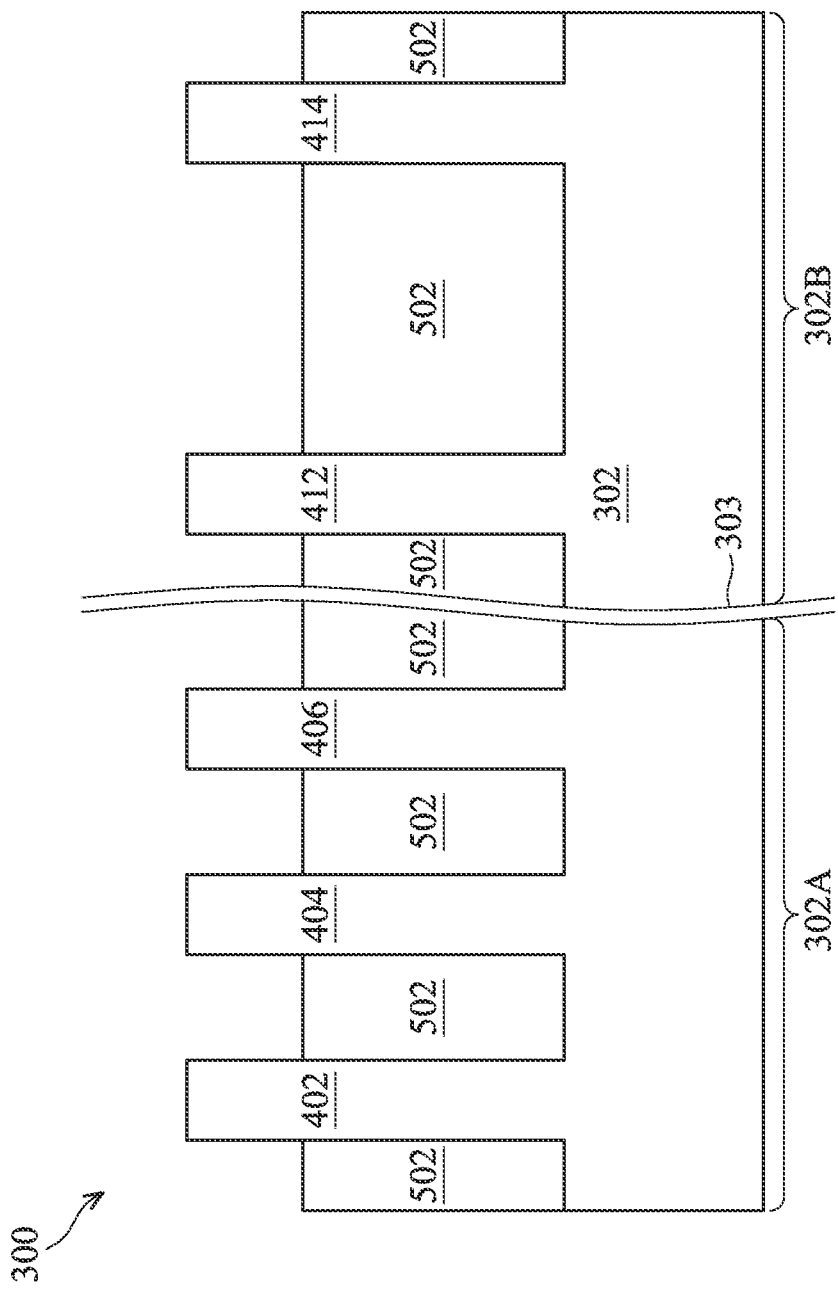

Corresponding to operation 208 of FIG. 2, FIG. 6 is a cross-sectional view of the transistor device 300 in which the flowable insulation layer 502 is recessed at one of the various stages of fabrication, in some embodiments. The cross-sectional view of FIG. 6 is cut along the lengthwise direction of an active/dummy gate structure of the transistor device 300 (e.g., cross-section A-A indicated in FIG. 1).

An upper portion of the flowable insulation layer 502 is removed such that respective upper portions of the semiconductor fin structures 402-406 and 412-414 protrude from between neighboring remaining flowable insulation layer 502. Respective top surfaces of the remaining flowable insulation layer 502 may have a flat surface (as illustrated in FIG. 6), a convex surface, a concave surface (such as dishing), or combinations thereof. The top surfaces of the flowable insulation layer 502 may be formed flat, convex, and/or concave by an appropriate etch. The flowable insulation layer 502 may be recessed using an acceptable dry or wet etching process, such as one that is selective to the material of the flowable insulation layer 502.

For example, a wet etching process may be used to remove the upper portion of the flowable insulation layer 502. The wet etching process can involve exposing the workpiece having the uncured flowable insulation layer 502 thereon to an etching solution. The etching solution may be a hydrochloric acid-hydrogen peroxide mixture (RPM), sulfuric acid-hydrogen peroxide mixture (SPM), or ammonium hydroxide-hydrogen peroxide mixture (APM). In certain embodiments, the etching solution is a dilute hydrofluoric acid solution. An amount of the flowable insulation layer 502 removed is controlled by the duration of exposure and the etchant.

In another example, a dry (e.g., plasma) etching process may be used to remove the upper portion of the flowable insulation layer 502. In such a plasma etching process (including radical plasma etching, remote plasma etching, and other suitable plasma etching processes), gaseous etchants such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gaseous etchants and combinations thereof can be used with passivation gases. The passivation gases can include nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the plasma etching process, the etchants and/or the passivation gases can be diluted with gases such as argon (Ar), helium (He), neon (Ne), and other suitable dilutive gases and combinations thereof.

Figure 7:
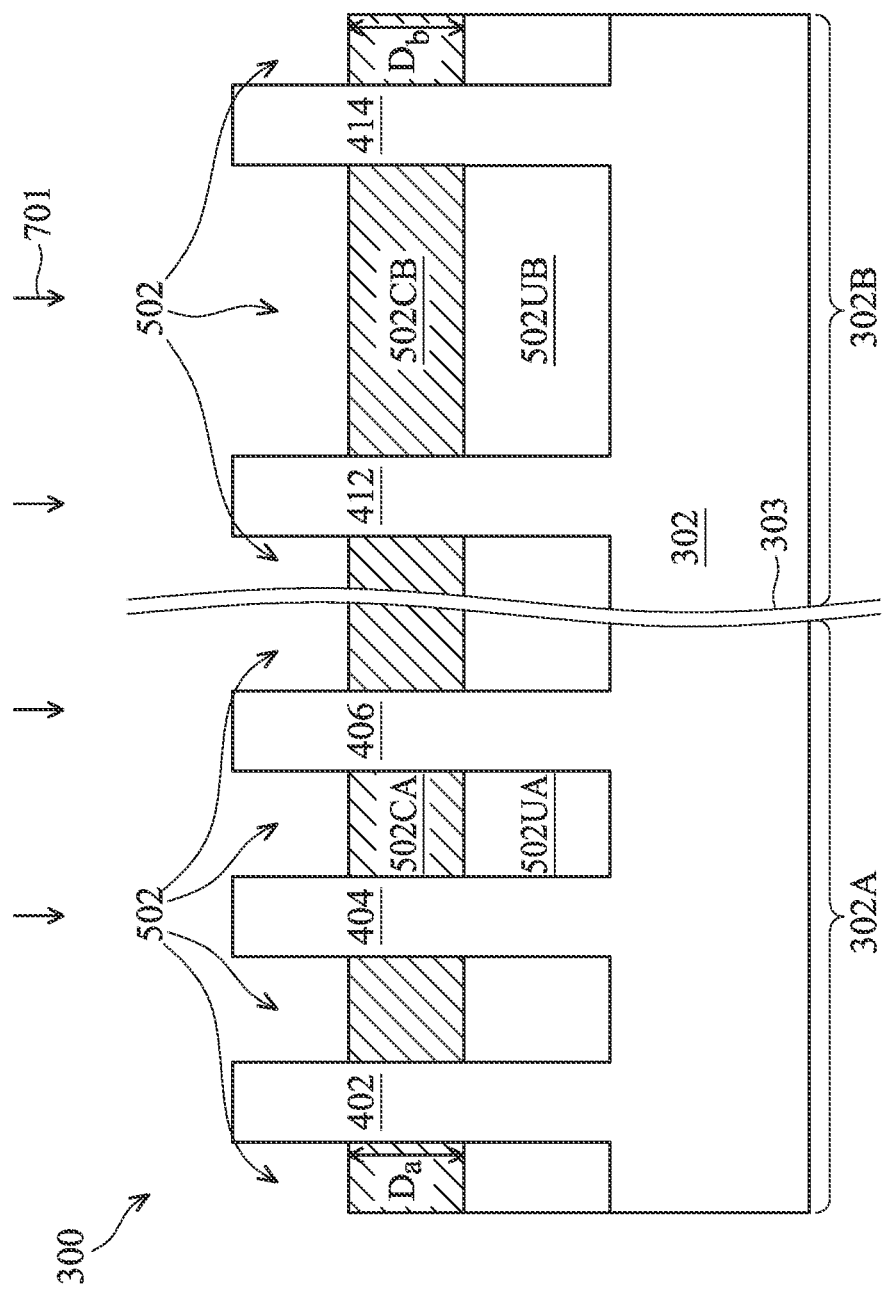

Corresponding to operation 210 of FIG. 2, FIG. 7 is a cross-sectional view of the transistor device 300 in which the (remaining) flowable insulation layer 502 is cured through a curing process 701 at one of the various stages of fabrication, in some embodiments. The cross-sectional view of FIG. 7 is cut along the lengthwise direction of an active/dummy gate structure of the transistor device 300 (e.g., cross-section A-A indicated in FIG. 1).

Upon being cured, at least a portion of the flowable insulation layer 502 may be converted from the uncured state to the cured state. In the illustrated example of FIG. 7, the flowable insulation layer 502 includes an uncured (e.g., lower) portion 502UA and a cured (e.g., upper) portion 502CA in the high density area 302A; and the flowable insulation layer 502 includes an uncured (e.g., lower) portion 502UB and a cured (e.g., upper) portion 502CB in the low density area 302B. In particular, the cured portion 502CA in the high density area 302A may have a depth (height), $D_a$, and the cured portion 502CB in the low density area 302B may have a depth (height), $D_b$. The depths $D_a$ and $D_b$ may be equal to or different from each other.

In various embodiments, the curing process 701 can include a radiation cure process, an oxidation cure process, a nitridization cure process, a thermal cure process, an electron beam cure process, an ion beam cure process, a plasma cure process, a microwave cure process, or combinations thereof. For example, the radiation cure process may include applying a radiation source over the uncured insulation layer 502, in which the radiation source can include an infrared (IR) radiation source, a visible radiation source, an ultra-violet (UV) radiation source, a vacuum-ultra-violet (VUV) radiation source, or combinations thereof. In another example, the oxidation cure process may include flowing at least one of $O_2$, CO, $CO_2$, or $SO_2$ to oxidize ligands of the uncured flowable insulation layer 502. In yet another example, the nitridization cure process may include flowing at least one of $N_2$ or $NH_3$ to nitridize ligands of the uncured flowable insulation layer 502.

Figure 8:
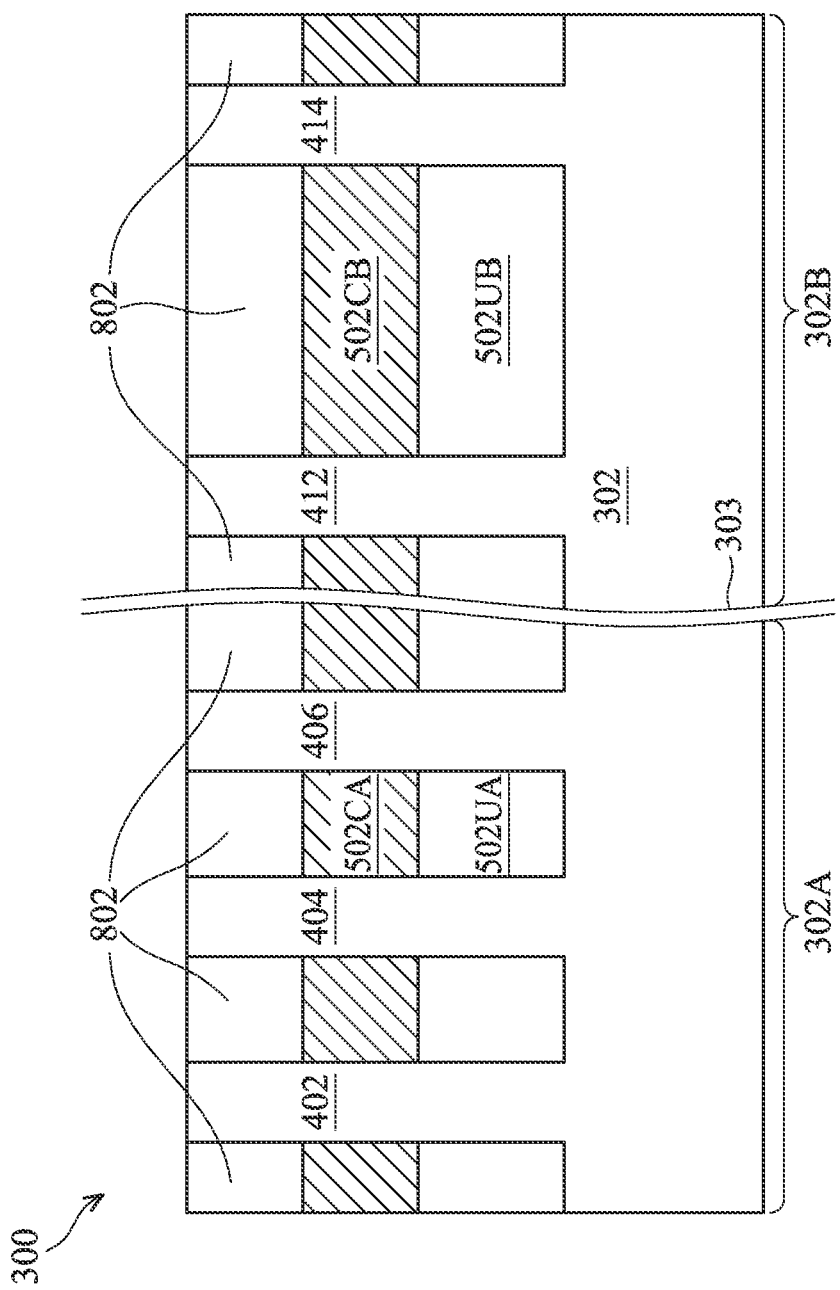

Corresponding to operation 212 of FIG. 2, FIG. 8 is a cross-sectional view of the transistor device 300 including an insulation material 802 at least partially filling the trenches 409 and 417 (FIG. 4) at one of the various stages of fabrication, in some embodiments. The cross-sectional view of FIG. 8 is cut along the lengthwise direction of an active/dummy gate structure of the transistor device 300 (e.g., cross-section A-A indicated in FIG. 1).

The insulation material 802 can be formed as a flowable insulation layer, hereinafter referred to as "flowable insulation layer 802." For example, the flowable insulation layer 802 can overfill the (remaining) trenches 409 and 417 and the semiconductor fin structures 402-406 and 412-414, optionally followed by a chemical mechanical polishing (CMP) process. In another example, the flowable insulation layer 802 can partially fill the trenches 409 and 417 (i.e., with a certain amount of upper portions of the semiconductor fin structures 402-406 and 412-414 protruding from the flowable insulation layer 802). Moreover, it should be understood that the trenches 409 and 417 can be filled with the insulation material 502 that is formed through a deposition-based process, for example, a chemical vapor deposition (CVD) process, a low-pressure chemical vapor deposition (LPCVD) process, a plasma enhanced chemical vapor deposition (PECVD) process, or the like, while remaining within the scope of the present disclosure.

The flowable insulation layer 802 can include a flowable silicon oxide or silicon nitride dielectric material, hereinafter referred to as "flowable insulation layer 802." The flowable insulation layer 802 is formed by using a spin on dielectric (SOD) such as a silicate, a siloxane, a methyl SilsesQuioxane (MSQ), a hydrogen SisesQuioxane (HSQ), an MSQ/HSQ, a perhydrosilazane (TCPS) or a perhydro-polysilazane (PSZ). Alternatively, the flowable insulation layer 802 can be formed by using a low temperature plasma chemical vapor deposition at a temperature less than about 100° C. under a pressure ranging from about 100 mTorr to about 10 Torr. A reaction source uses a gaseous environment containing $Si_3H_9N$ and $NH_3$. In one embodiment, the flow rates of $Si_3H_9N$ and $NH_3$ should be in the range of about 100 standard cubic centimeters per minute (sccm) to about 1000 sccm, and of about 100 sccm to about 2000 sccm, respectively. The flowable insulation layer 802 can fill the narrow and deep gaps and prevents voids and discontinuities in an STI structure.

Figure 9:
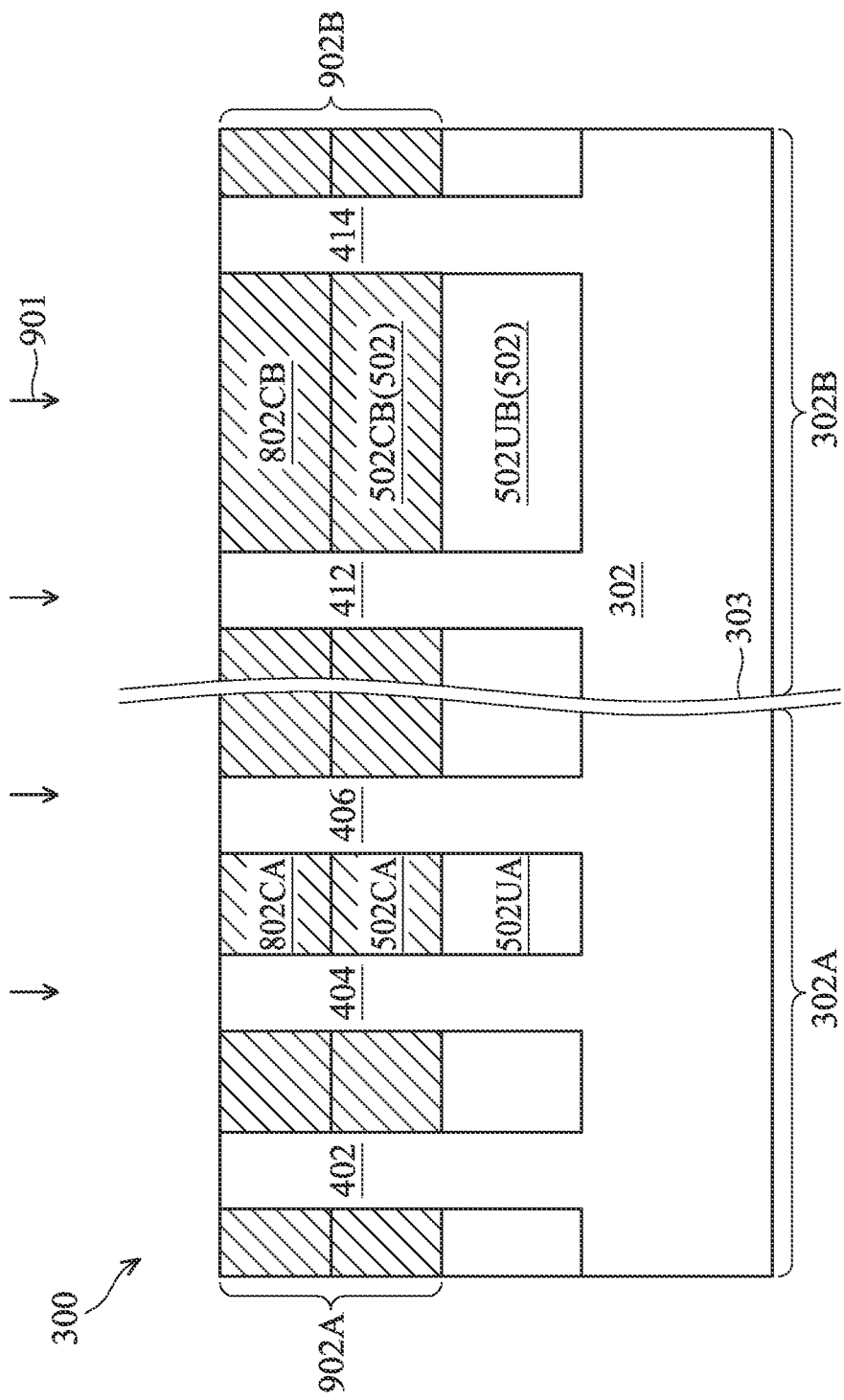

Corresponding to operation 214 of FIG. 2, FIG. 9 is a cross-sectional view of the transistor device 300 in which the at least the flowable insulation layer 802 is cured through a curing process 901 at one of the various stages of fabrication, in some embodiments. The cross-sectional view of FIG. 9 is cut along the lengthwise direction of an active/dummy gate structure of the transistor device 300 (e.g., cross-section A-A indicated in FIG. 1).

In various embodiments, at least the flowable insulation layer 802 may be converted from the uncured state to the cured state. For example, the cured insulation layer 802 includes a portion 802CA in the area 302A and a portion 802CB in the area 302B, respectively. In various embodiments, the cured portion 802CA can contact the cure portion 502CA to form a thick enough cured insulation stack, hereinafter cured insulation stack 902A, in the area 302A. Similarly, the cured portion 802CB can contact the cure portion 502CB to form a thick enough cured insulation stack, hereinafter cured insulation stack 902B, in the area 302B. Such a sequence of etching, curing, deposition, and curing processes can be iteratively performed to form a cured insulation stack that includes a number of cured insulation layers in both of the high density and low density areas.

By forming such a thick enough cured insulation stack across the areas with different densities, an etching process can be universally applied on the areas, while forming the STI structures in the areas with similar heights. When the cured insulation stacks in the trenches of the areas with different densities are thick enough, an etchant of the universal etching process can etch the cured insulation stacks in similar etching rates, while not reacting with any uncured insulation layer disposed therebelow. As such, the recessed depths across the different areas can still be controlled as being similar, which allows the semiconductor fin structures in the different areas to expose with a similar height.

In various embodiments, the curing process 901 can include a radiation cure process, an oxidation cure process, a nitridization cure process, a thermal cure process, an electron beam cure process, an ion beam cure process, a plasma cure process, a microwave cure process, or combinations thereof. For example, the radiation cure process may include applying a radiation source over the uncured insulation layer 802, in which the radiation source can include an infrared (IR) radiation source, a visible radiation source, an ultra-violet (UV) radiation source, a vacuum-ultra-violet (VUV) radiation source, or combinations thereof. In another example, the oxidation cure process may include flowing at least one of $O_2$, CO, $CO_2$, or $SO_2$ to oxidize ligands of the uncured flowable insulation layer 802. In yet another example, the nitridization cure process may include flowing at least one of $N_2$ or $NH_3$ to nitridize ligands of the uncured flowable insulation layer 802.

Figure 10:
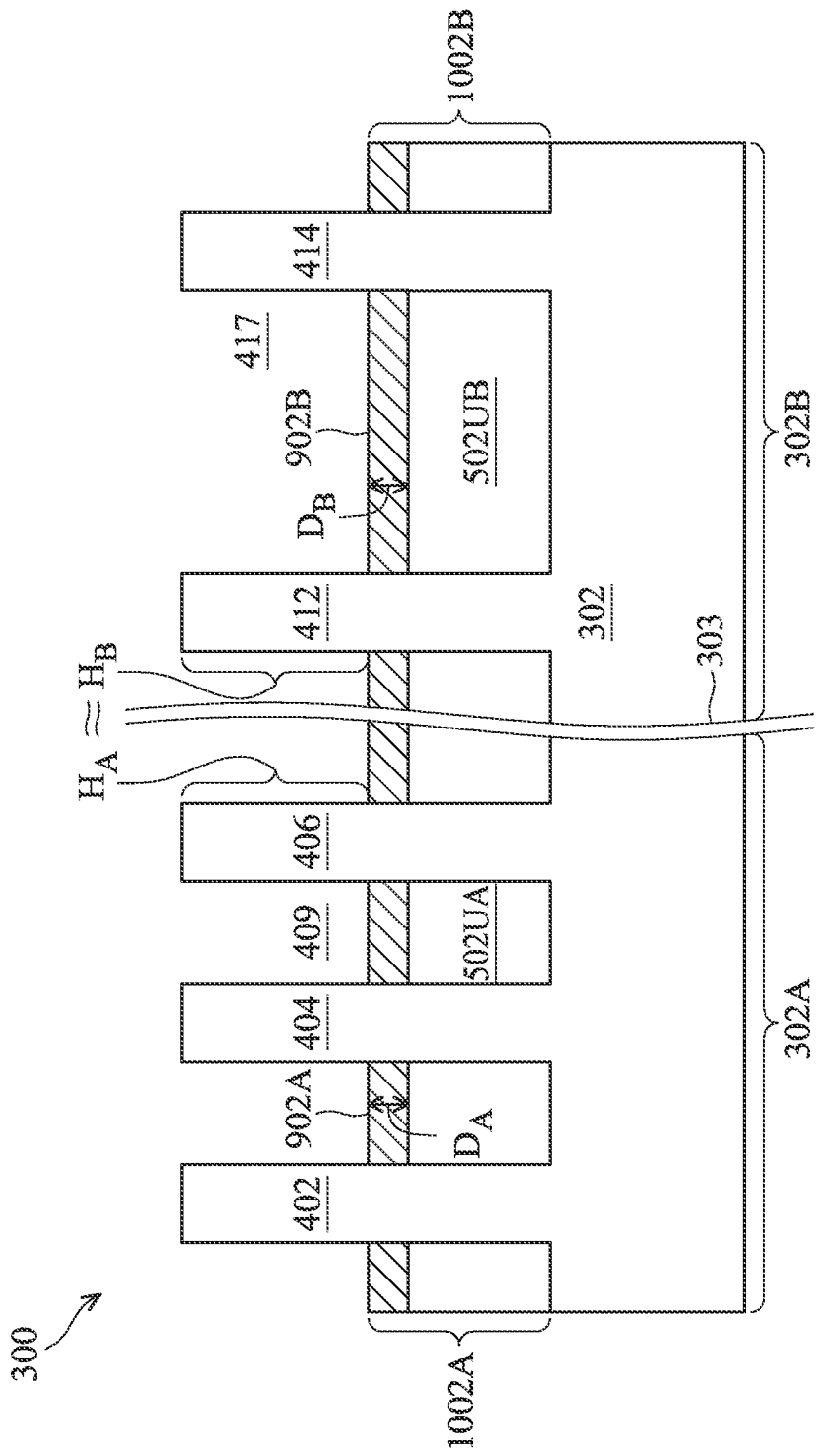

Corresponding to operation 216 of FIG. 2, FIG. 10 is a cross-sectional view of the transistor device 300 in which the cured insulation stacks 902A and 902B (FIG. 9) are recessed at one of the various stages of fabrication, in some embodiments. The cross-sectional view of FIG. 10 is cut along the lengthwise direction of an active/dummy gate structure of the transistor device 300 (e.g., cross-section A-A indicated in FIG. 1).

In various embodiments, respective upper portions of the cured insulation stack 902A in the area 302A and the cured insulation stack 902B in the area 302B can be concurrently removed. As discussed above, by forming the cured insulation stacks 902A and 902B in thick enough thicknesses (which may be similar to or different from each other), amounts of the removed upper portions of the cured insulation stacks 902A and 902B can be similar, which allows a height ($H_A$) of the semiconductor fin structures 402-406 in the area 302A and a height ($H_B$) of the semiconductor fin structures 412-414 in the area 302B to be approximately the same (i.e., with a difference between $H_A$ and $H_B$ equal to about 0 nanometers (nm)). Alternatively, the difference between $H_A$ and $H_B$ may be greater than 0 nm but less than about 15 nm, while remaining within the scope of the present disclosure. As a non-limiting example, the heights $H_A$ and $H_B$ may each range between about 40 nm and about 300 nm. In various embodiments, the remaining cured insulation stack 902A and the underlying insulation layer (e.g., the uncured insulation portion 502UA) can collectively form a STI structure 1002A that embeds respective lower portions of the semiconductor fin structures 402-406; and the remaining cured insulation stack 902B and the underlying insulation layer (e.g., the uncured insulation portion 502UB) can collectively form a STI structure 1002B that embeds respective lower portions of the semiconductor fin structures 412-414.

In various embodiments, the remaining cured insulation stack 902A may be characterized with a depth (height), $D_A$; and the remaining cured insulation stack 902B may be characterized with a depth (height), $D_B$. The depths $D_A$ and $D_B$ may be equal to or different from each other. For example, when the cured depths $D_a$ and $D_b$ (FIG. 7) are about the same, the depths $D_A$ and $D_B$ may be similar to each other. In another example, when the cured depth $D_a$ is less than $D_b$ (FIG. 7), the depth $D_B$ in the low density area 302B may be greater than the depth $D_A$ in the high density area 302A. The depths $D_A$ and $D_B$ may each range between about 1 nm and about 500 nm.

Respective top surfaces of the STI structures 1002A-B may have a flat surface (as illustrated in FIG. 10), a convex surface, a concave surface (such as dishing), or combinations thereof. The top surfaces of the STI structures 1002A-B may be formed flat, convex, and/or concave by an appropriate etch. The STI structures 1002A-B may be formed by recessing the cured insulation stacks 902A-B using an acceptable dry or wet etching process, such as one that is selective to the material of the cured insulation stack 902A-B.

For example, a wet etching process may be used to remove the upper portion of the cured insulation stack 902A-B. The wet etching process can involve exposing the workpiece having the cured insulation stack 902A-B thereon to an etching solution. The etching solution may be a hydrochloric acid-hydrogen peroxide mixture (RPM), sulfuric acid-hydrogen peroxide mixture (SPM), or ammonium hydroxide-hydrogen peroxide mixture (APM). In certain embodiments, the etching solution is a dilute hydrofluoric acid solution. An amount of the cured insulation stack 902A-B removed is controlled by the duration of exposure and the etchant.

In another example, a dry (e.g., plasma) etching process may be used to remove the upper portion of the cured insulation stack 902A-B. In such a plasma etching process (including radical plasma etching, remote plasma etching, and other suitable plasma etching processes), gaseous etchants such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1, 3-butadiene ($C_4F_6$), boron trichloride ($BCl_3$), sulfur hexafluoride ($SF_6$), hydrogen ($H_2$), nitrogen trifluoride ($NF_3$), and other suitable gaseous etchants and combinations thereof can be used with passivation gases. The passivation gases can include nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the plasma etching process, the etchants and/or the passivation gases can be diluted with gases such as argon (Ar), helium (He), neon (Ne), and other suitable dilutive gases and combinations thereof.

Figure 11:
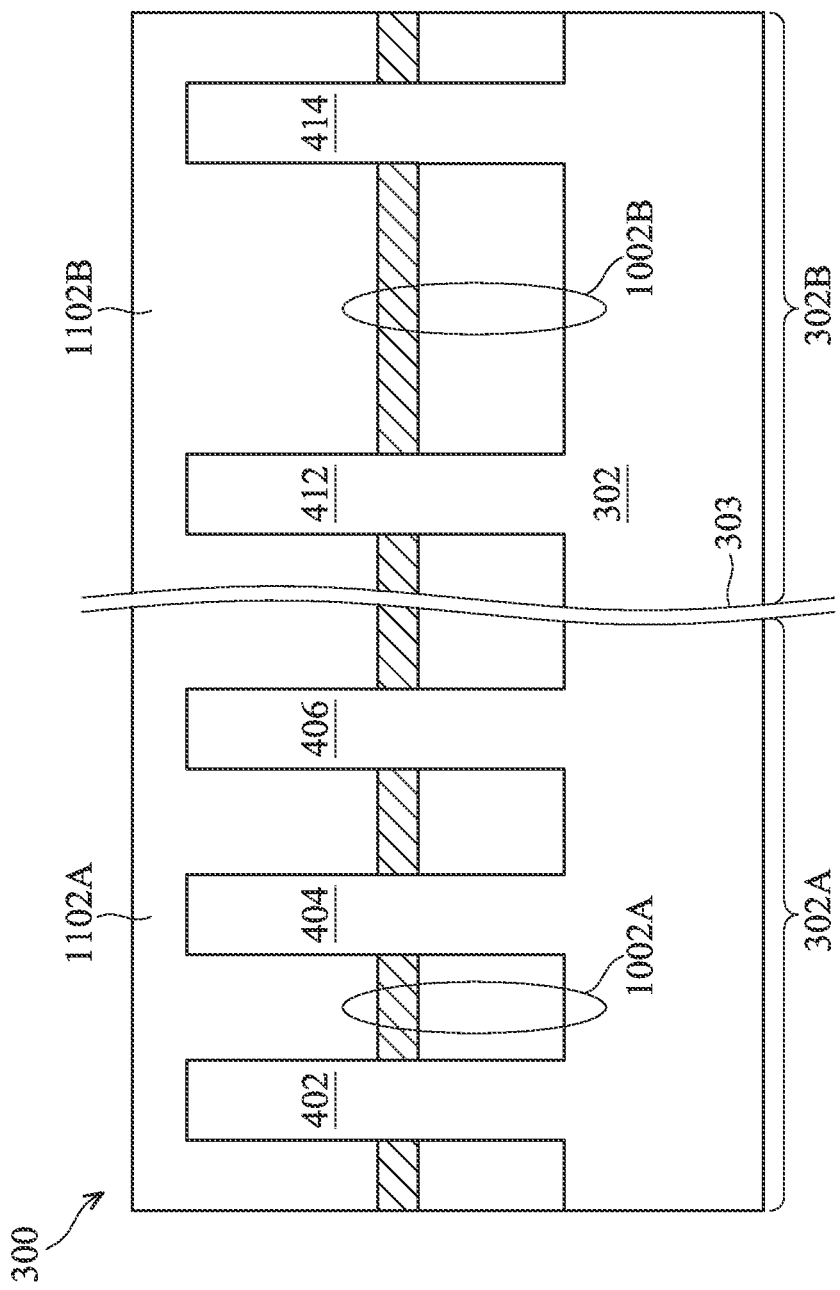

Corresponding to operation 218 of FIG. 2, FIG. 11 is a cross-sectional view of the transistor device 300 including an active gate structure 1102A in the area 302A and an active gate structure 1102B in the area 302B at one of the various stages of fabrication, in some embodiments. The cross-sectional view of FIG. 11 is cut along the lengthwise direction of an active/dummy gate structure of the transistor device 300 (e.g., cross-section A-A indicated in FIG. 1).

As shown, the active gate structure 1102A may straddle (e.g., respective central portions) of the semiconductor fin structures 402-406, with its bottom surface contacting the STI structure 1002A; and the active gate structure 1102B may straddle (e.g., respective central portions) of the semiconductor fin structures 412-414, with its bottom surface contacting the STI structure 1002B. The semiconductor fin structures 402-406 and 412-414 protrude from the STI structures 1002A and 1002B, respectively, with the similar height. Thus, even over the semiconductor fin structures disposed in different densities, the active gate structures 1102A and 1102B can be formed with a similar gate height.

It should be understood that prior to forming the active gate structures 1102A-B, a number of features may have been formed in the transistor device 300, which will be briefly described as follows. For example, following the formation of the STI structures, dummy gate structures can be formed to straddle the semiconductor fin structures 402-406 and 412-414, respectively. Next, on opposite sides of each of the dummy gate structures, one or more source/drain structures can be epitaxially grown in each of the semiconductor fin structures, followed by forming an inter-layer dielectric (ILD) overlaying the source/drain structures. Next, the dummy gate structures may be replaced with the active gate structures, as illustrated in FIG. 11.

The active gate structures 1102A-B can each include a gate dielectric layer, a metal gate layer, and one or more other layers that are not shown for clarity. For example, each of the active gate structures 1102A-B may further include a capping layer and a glue layer. The capping layer can protect the underlying work function layer from being oxidized. In some embodiments, the capping layer may be a silicon-containing layer, such as a layer of silicon, a layer of silicon oxide, or a layer of silicon nitride. The glue layer can function as an adhesion layer between the underlying layer and a subsequently formed gate electrode material (e.g., tungsten) over the glue layer. The glue layer may be formed of a suitable material, such as titanium nitride.

The gate dielectric layers each include silicon oxide, silicon nitride, or multilayers thereof. In example embodiments, the gate dielectric layers each include a high-k dielectric material, and in these embodiments, the gate dielectric layers may each have a k value greater than about 7.0, and may include a metal oxide or a silicate of Hf, Al, Zr, La, Mg, Ba, Ti, Pb, or combinations thereof. The formation methods of the gate dielectric layers 1802 and 1822 may include molecular beam deposition (MBD), atomic layer deposition (ALD), PECVD, and the like. A thickness of each of the gate dielectric layers may be between about 8 angstroms (Å) and about 20 Å, as an example.

The metal gate layers may each be a P-type work function layer, an N-type work function layer, multi-layers thereof, or combinations thereof, in some embodiments. Accordingly, the metal gate layers may each be referred to as a work function layer, in some embodiments. In the discussion herein, a work function layer may also be referred to as a work function metal. Example P-type work function metals that may be included in the gate structures for P-type devices include TiN, TaN, Ru, Mo, Al, WN, $ZrSi_2$, $MoSi_2$, $TaSi_2$, $NiSi_2$, WN, other suitable P-type work function materials, or combinations thereof. Example N-type work function metals that may be included in the gate structures for N-type devices include Ti, Ag, TaAl, TaC, TiAlN, TaC, TaCN, TaSiN, Mn, Zr, other suitable N-type work function materials, or combinations thereof.

A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), ALD, and/or other suitable process. The thickness of a P-type work function layer may be between about 8 Å and about 15 Å, and the thickness of an N-type work function layer may be between about 15 Å and about 30 Å, as an example.

FIGS. 12A, 12B, 13A, 13B, 14A, 14B, 15A, and 15B respectively illustrate cross-sectional views of the transistor device 300, in various other embodiments. For example in FIGS. 12A-B, each of the STI structures 1002A and 1002B may include a stack of a number of cured insulation layers, which are formed of a similar insulation material; in FIGS. 13A-B, each of the STI structures 1002A and 1002B may include a stack of a number of cured insulation layers, which are formed of respective different insulation materials; in FIGS. 14A-B, each of the STI structures 1002A and 1002B may include a stack of a number of uncured and cured insulation layers, which are formed of a similar insulation material; and in FIGS. 15A-B, each of the STI structures 1002A and 1002B may include a stack of a number of uncured and cured insulation layers, some of which are formed of a similar insulation material and some of which are formed of respective different insulation materials.

Figure 12A:
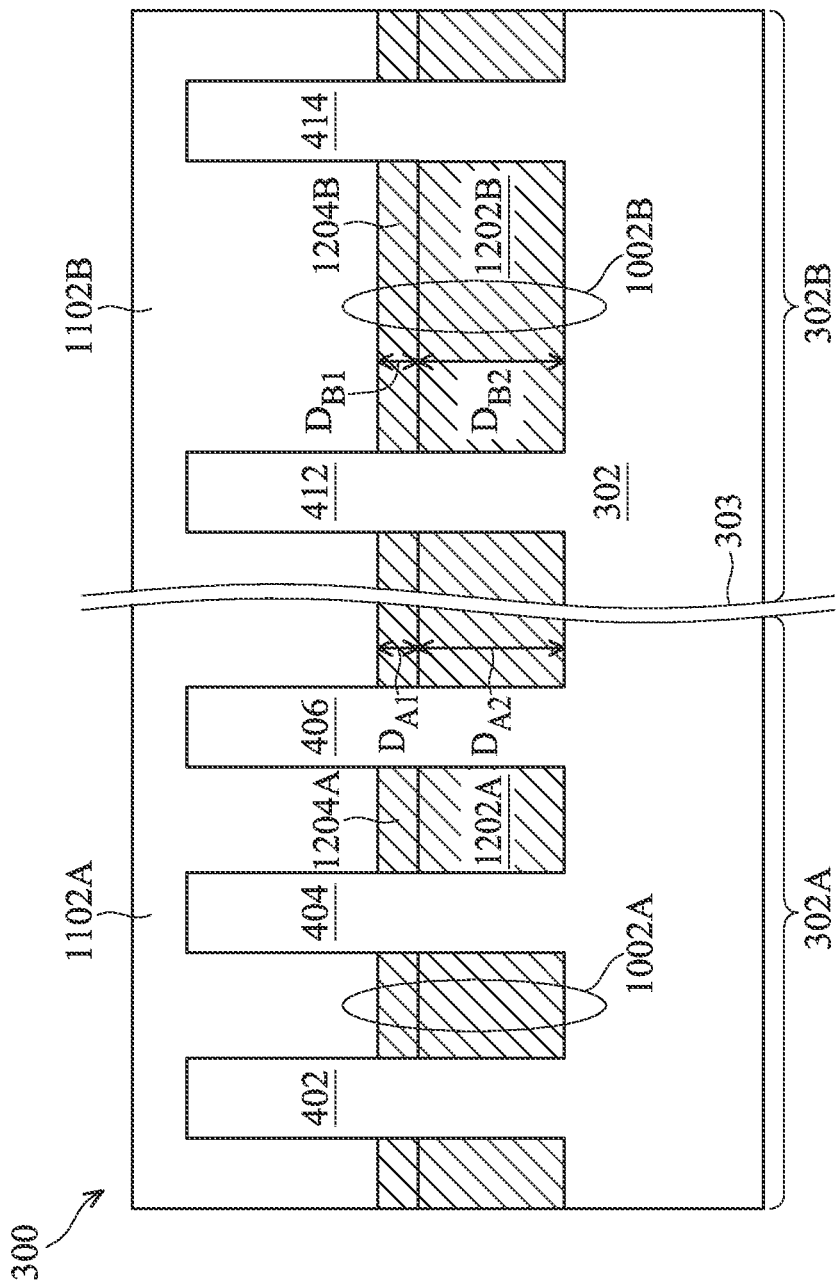
FIGS. 12A, 12B, 13A, 13B, 14A, 14B, 15A, and 15B illustrate cross-sectional views of the example FinFET device of FIGS. 3-11, in accordance with some other embodiments.

To form the STI structures 1002A-B shown in FIG. 12A, some of the operations of the method 200 can be again performed with minor changes. For example, when recessing first flowable insulation layers 1202A-B (e.g., operation 208), the flowable insulation layers 1202A-B may be formed shorter, followed by curing almost all the remaining flowable insulation layers 1202A-B (e.g., operation 210). Next, operations 212-218 can be again performed with no changes to form second flowable insulation layers 1204A-B (in the cured state), thereby forming the STI structures 1002A-B of FIG. 12A. The first and second flowable insulation layers may be formed of a similar dielectric material. The first insulation layer 1202A, second insulation layer 1204A, first insulation layer 1202B, and second insulation layer 1204B may have their heights (depths), $D_{A2}$, $D_{A1}$, $D_{B2}$, and $D_{B1}$, respectively. $D_{A2}$ and $D_{B2}$ may be similar to or different from each other; and $D_{A1}$ and $D_{B1}$ may be similar to or different from each other.

Figure 12B:
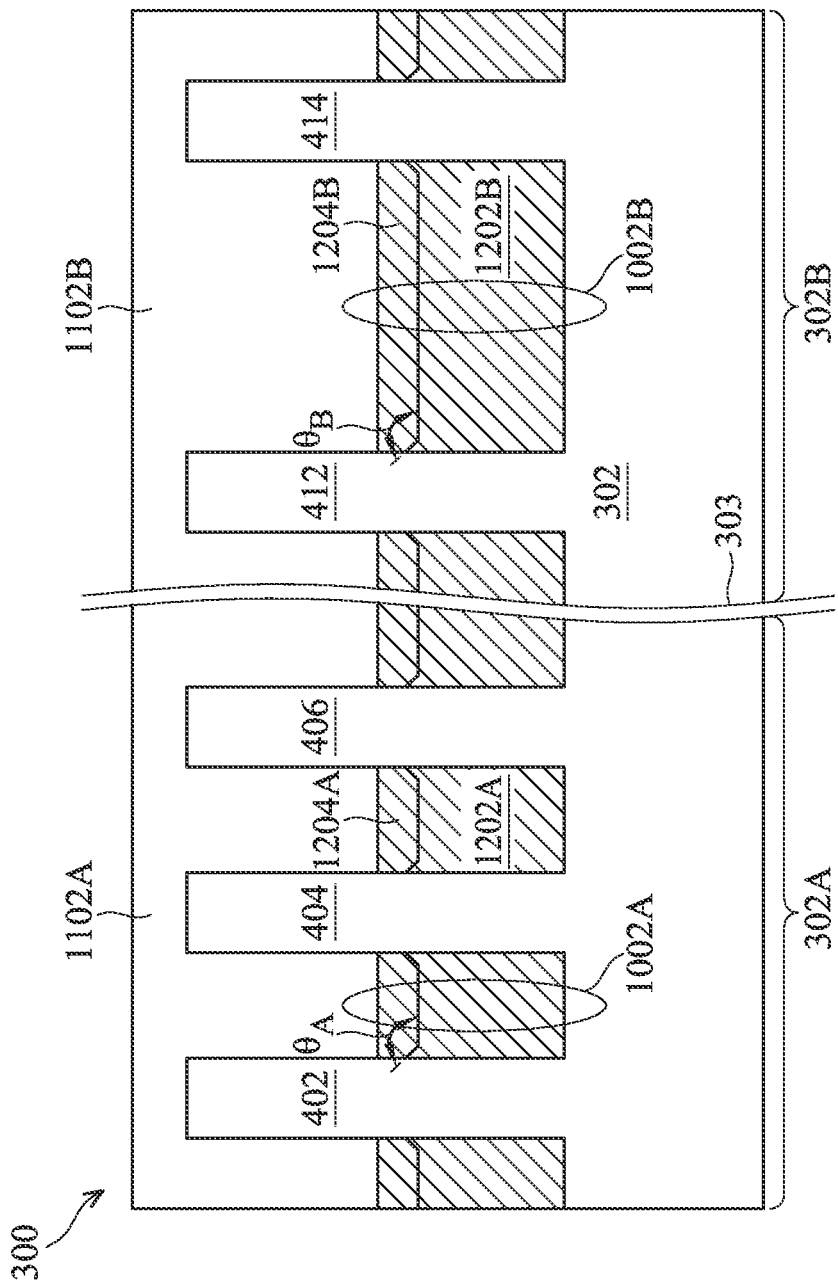

In some other embodiments, when recessing an insulation layer, the top surface may present a curvature-based profile (e.g., a concave surface, a convex surface, or combinations thereof). For example, the STI structures 1002A-B shown in FIG. 12B present a curvature-based intermediate surface at an interface between the first and second flowable insulation layers. Such a curvature-based intermediate interface can be characterized with one or more non-right angles. For example, angles, OA and OB, exist between a relatively flat middle portion and a relatively curved (or otherwise bent) end portion of the interface between the insulation layers 1202A and 1204A, and between the insulation layers 1202B and 1204B. The angles $\theta_A$ and $\theta_B$ may each be an obtuse angle between about 95 degrees and about 140 degrees. The curvature-based intermediate interface may be formed during the recessing of the first flowable insulation layers 1202A-B.

Figure 13A:
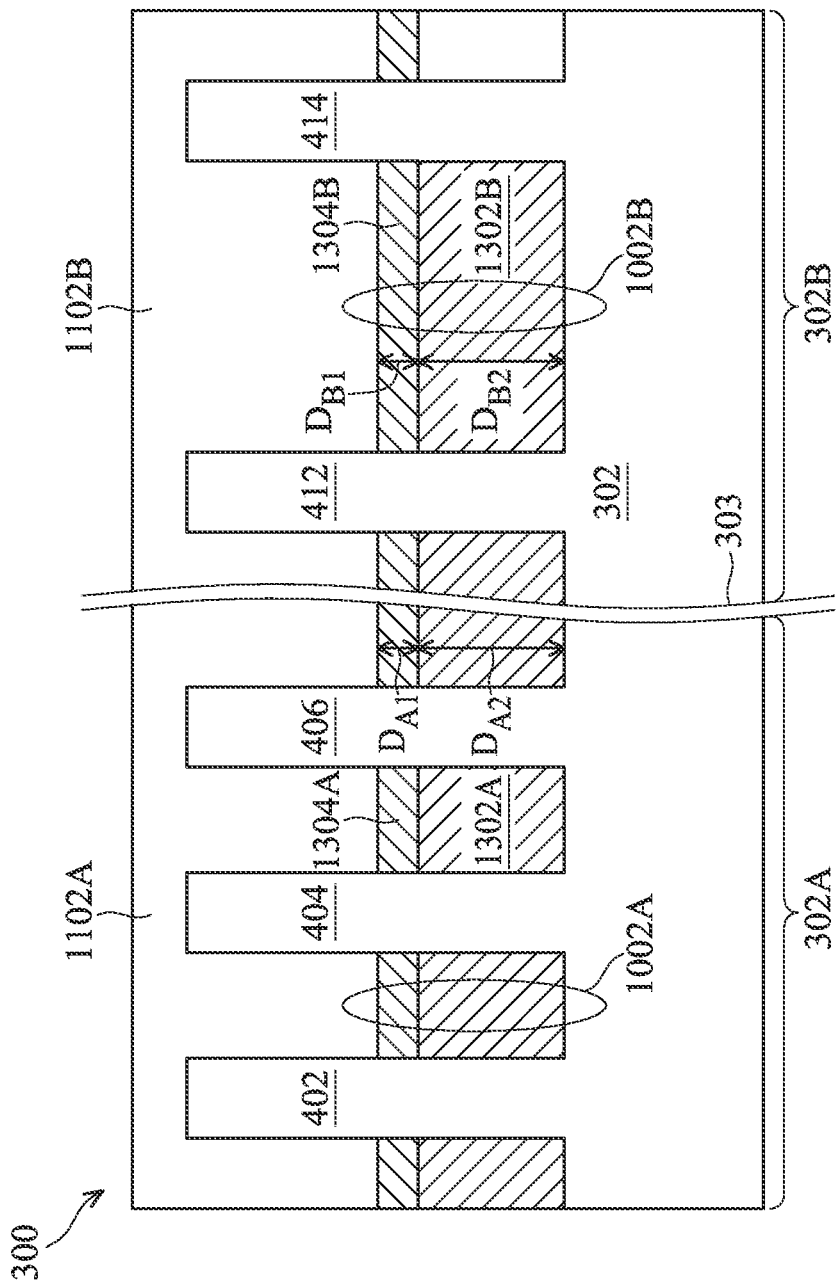

To form the STI structures 1002A-B shown in FIG. 13A, some of the operations of the method 200 can be again performed with minor changes. For example, when recessing first flowable insulation layers 1302A-B (e.g., operation 208), the flowable insulation layers 1302A-B may be formed shorter, followed by curing almost all the remaining flowable insulation layers 1302A-B (e.g., operation 210). Next, operations 212-218 can be again performed with no changes to form second flowable insulation layers 1304A-B (in the cured state), thereby forming the STI structures 1002A-B of FIG. 13A. The first and second flowable insulation layers may be formed of respective different dielectric materials. The first insulation layer 1302A, second insulation layer 1304A, first insulation layer 1302B, and second insulation layer 1304B may have their heights (depths), $D_{A2}$, $D_{A1}$, $D_{B2}$, and $D_{B1}$, respectively. $D_{A2}$ and $D_{B2}$ may be similar to or different from each other; and $D_{A1}$ and $D_{B1}$ may be similar to or different from each other.

Figure 13B:
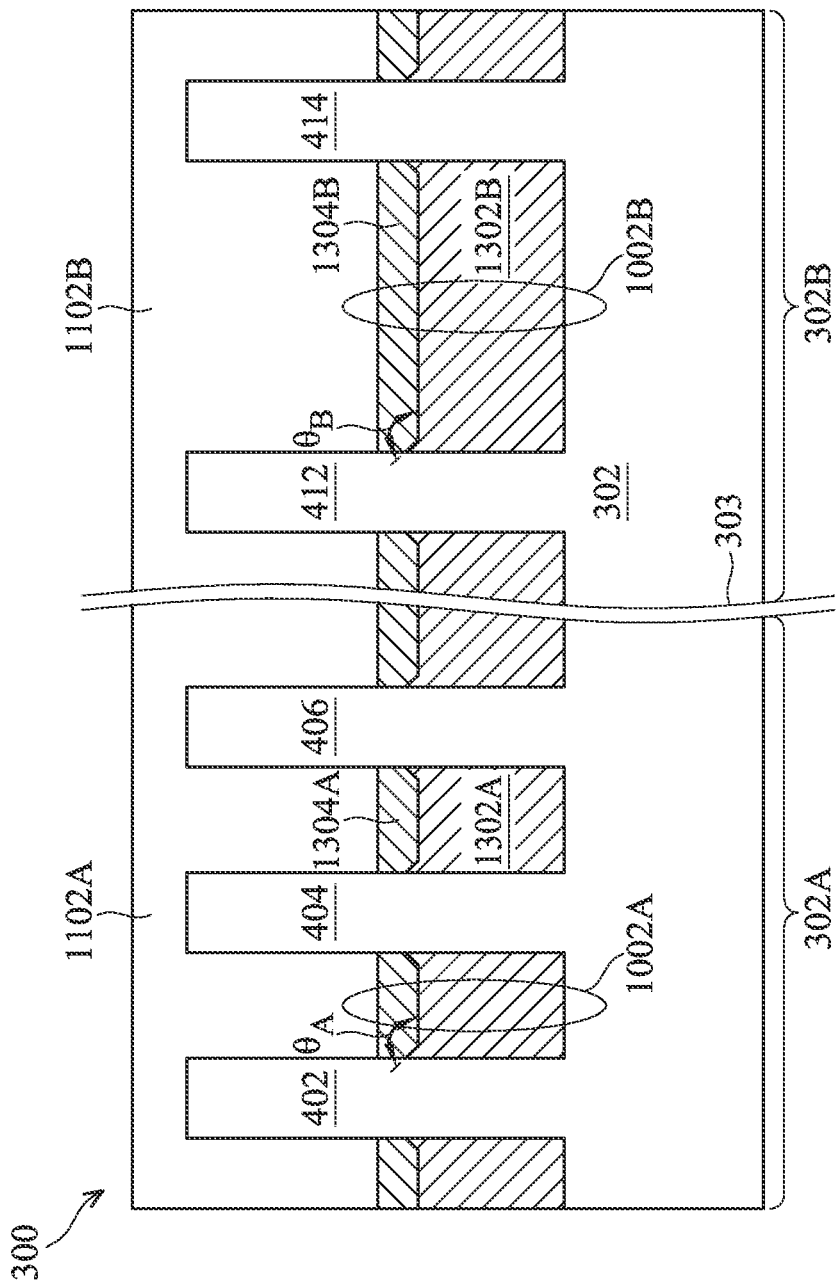

In some other embodiments, when recessing an insulation layer, the top surface may present a curvature-based profile (e.g., a concave surface, a convex surface, or combinations thereof). For example, the STI structures 1002A-B shown in FIG. 13B present a curvature-based intermediate surface at an interface between the first and second flowable insulation layers. Such a curvature-based intermediate interface can be characterized with one or more non-right angles. For example, angles, OA and OB, exist between a relatively flat middle portion and a relatively curved (or otherwise bent) end portion of the interface between the insulation layers 1302A and 1304A, and between the insulation layers 1302B and 1304B. The angles $\theta_A$ and $\theta_B$ may each be an obtuse angle between about 95 degrees and about 140 degrees. The curvature-based intermediate interface may be formed during the recessing of the first flowable insulation layers 1302A-B.

Figure 14A:
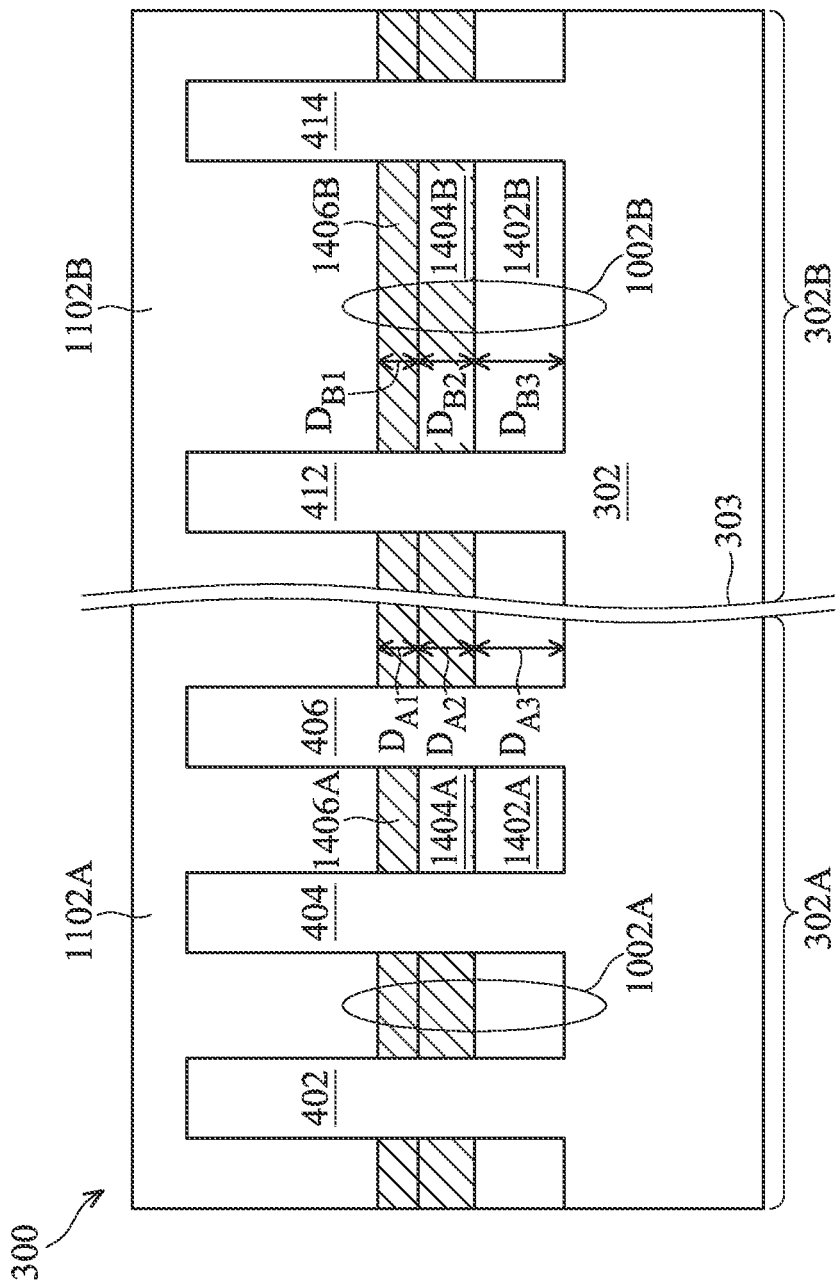

To form the STI structures 1002A-B shown in FIG. 14A, some of the operations of the method 200 can be iteratively performed. For example, after curing second insulation layers 1404A-B disposed above first insulation layers 1402A-B which may or may not remain in the uncured state (e.g., operations up to 214), operations 212 and 214 may be again performed to form third insulation layers 1406A-B (in the cured state). Operations 212 and 214 can be performed more than once. As such, the STI structures 1002A-B of FIG. 14A, each of which includes a stack of two or more cured insulation layers disposed above an uncured insulation layer, can be formed. In some embodiments, the number of iterations of operations 212 to 214 may correspond to the number of cured insulation layers of the stack. The first, second, and third flowable insulation layers may be formed of a similar dielectric material. The first insulation layer 1402A, second insulation layer 1404A, third insulation layer 1406A, first insulation layer 1402B, second insulation layer 1404B, and third insulation layer 1406B may have their heights (depths), $D_{A3}$, $D_{A2}$, $D_{A1}$, $D_{B3}$, $D_{B2}$, $D_{B1}$, respectively. $D_{A3}$ and $D_{B3}$ may be similar to or different from each other; $D_{A2}$ and $D_{B2}$ may be similar to or different from each other; and $D_{A1}$ and $D_{B1}$ may be similar to or different from each other.

Figure 14B:
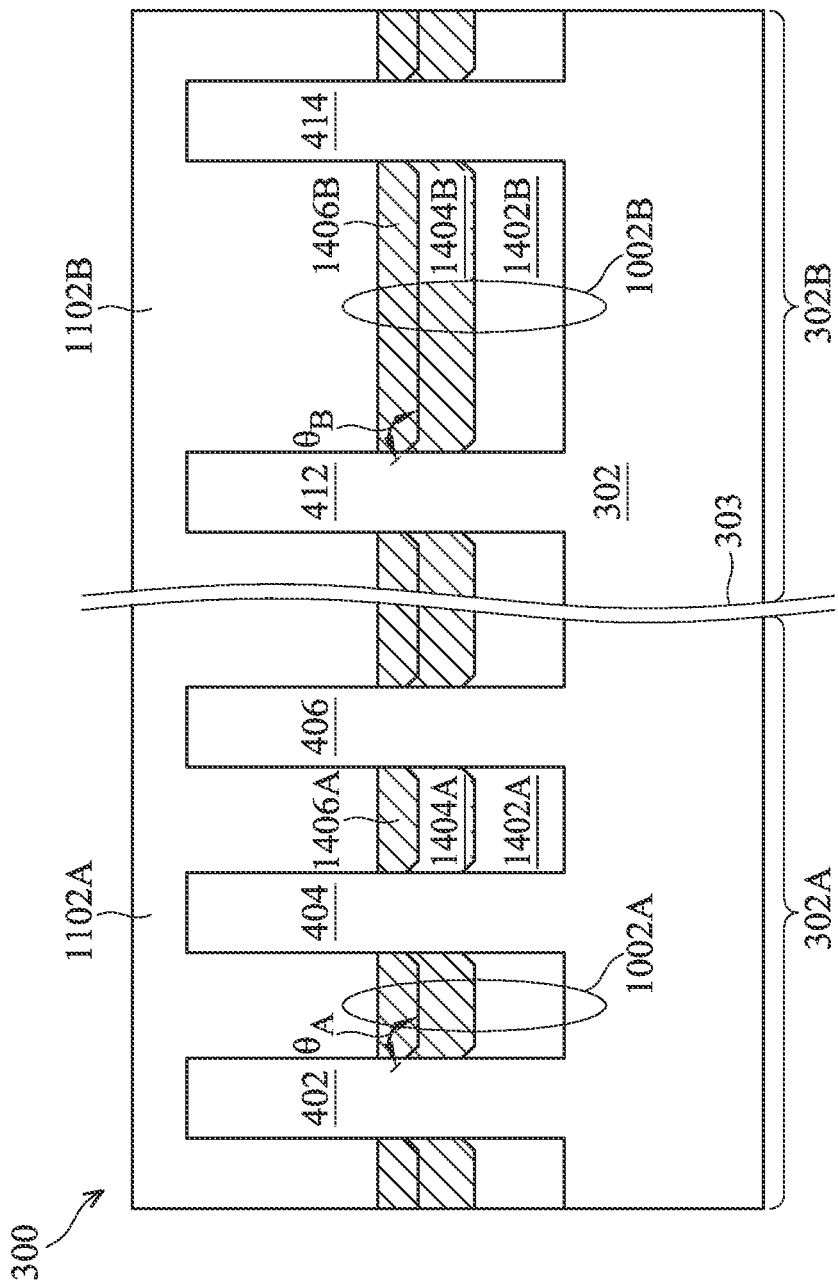

In some other embodiments, when recessing an insulation layer, the top surface may present a curvature-based profile (e.g., a concave surface, a convex surface, or combinations thereof). For example, the STI structures 1002A-B shown in FIG. 14B present at least one of a curvature-based intermediate surface at an interface between the first and second flowable insulation layers, or a curvature-based intermediate surface at an interface between the second and third flowable insulation layers. Such a curvature-based intermediate interface can be characterized with one or more non-right angles. For example, angles, $\theta_A$ and $\theta_B$, exist between a relatively flat middle portion and a relatively curved (or otherwise bent) end portion of the interface between the insulation layers 1404A and 1406A, and between the insulation layers 1404B and 1406B. The angles $\theta_A$ and $\theta_B$ may each be an obtuse angle between about 95 degrees and about 140 degrees. The curvature-based intermediate interfaces may be formed during the recessing of the first flowable insulation layers 1402A-B and/or the second flowable insulation layers 1404A-B.

Figure 15A:
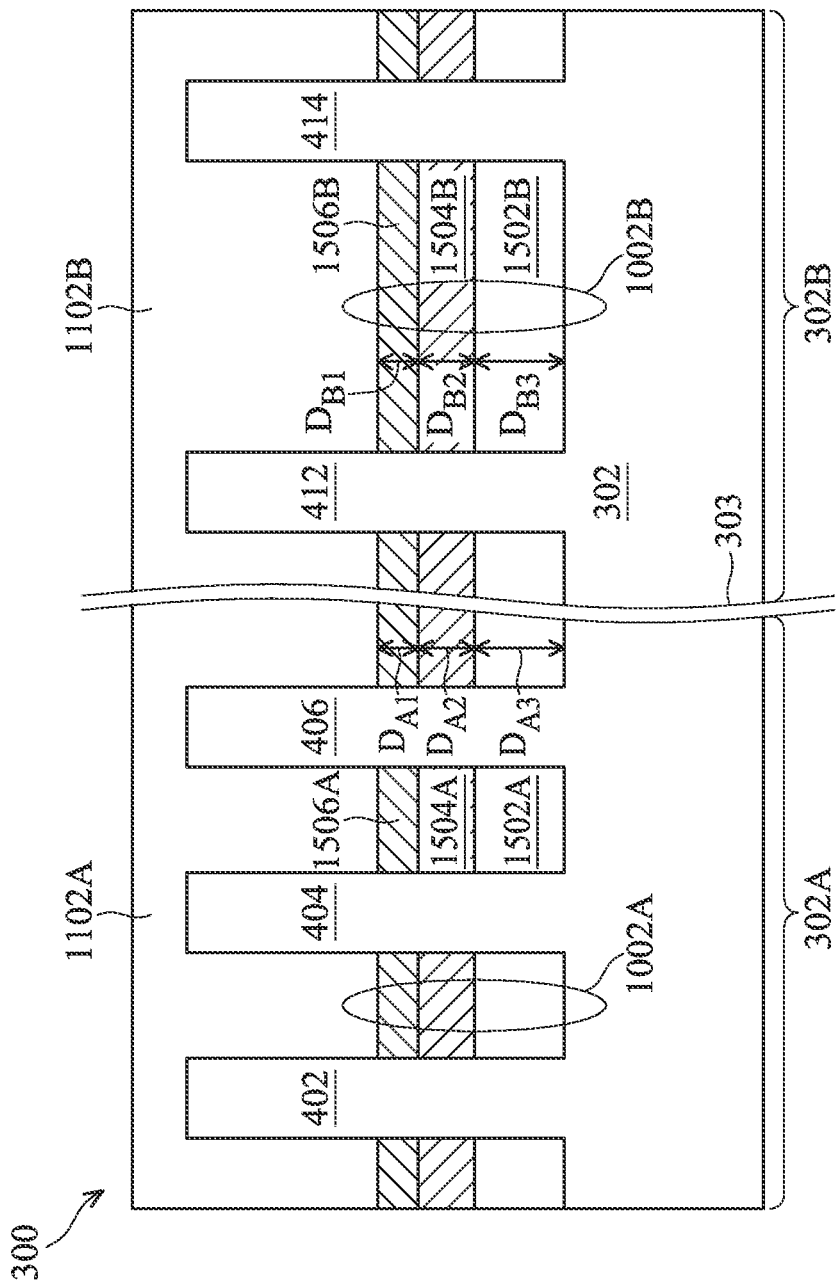

To form the STI structures 1002A-B shown in FIG. 15A, some of the operations of the method 200 can be iteratively performed. For example, after curing second insulation layers 1504A-B disposed above first insulation layers 1502A-B which may or may not remain in the uncured state (e.g., operations up to 214), operations 212 and 214 may be again performed to form third insulation layers 1506A-B (in the cured state). Operations 212 and 214 can be performed more than once. As such, the STI structures 1002A-B of FIG. 15A, each of which includes a stack of two or more cured insulation layers disposed above an uncured insulation layer, can be formed. In some embodiments, the number of iterations of operations 212 to 214 may correspond to the number of cured insulation layers of the stack. Some of the first, second, and third flowable insulation layers may be formed of respective different dielectric materials. The first insulation layer 1502A, second insulation layer 1504A, third insulation layer 1506A, first insulation layer 1502B, second insulation layer 1504B, and third insulation layer 1506B may have their heights (depths), $D_{A3}$, $D_{A2}$, $D_{A1}$, $D_{B3}$, $D_{B2}$, $D_{B1}$, respectively. $D_{A3}$ and $D_{B3}$ may be similar to or different from each other; $D_{A2}$ and $D_{B2}$ may be similar to or different from each other; and $D_{A1}$ and $D_{B1}$ may be similar to or different from each other.

Figure 15B:
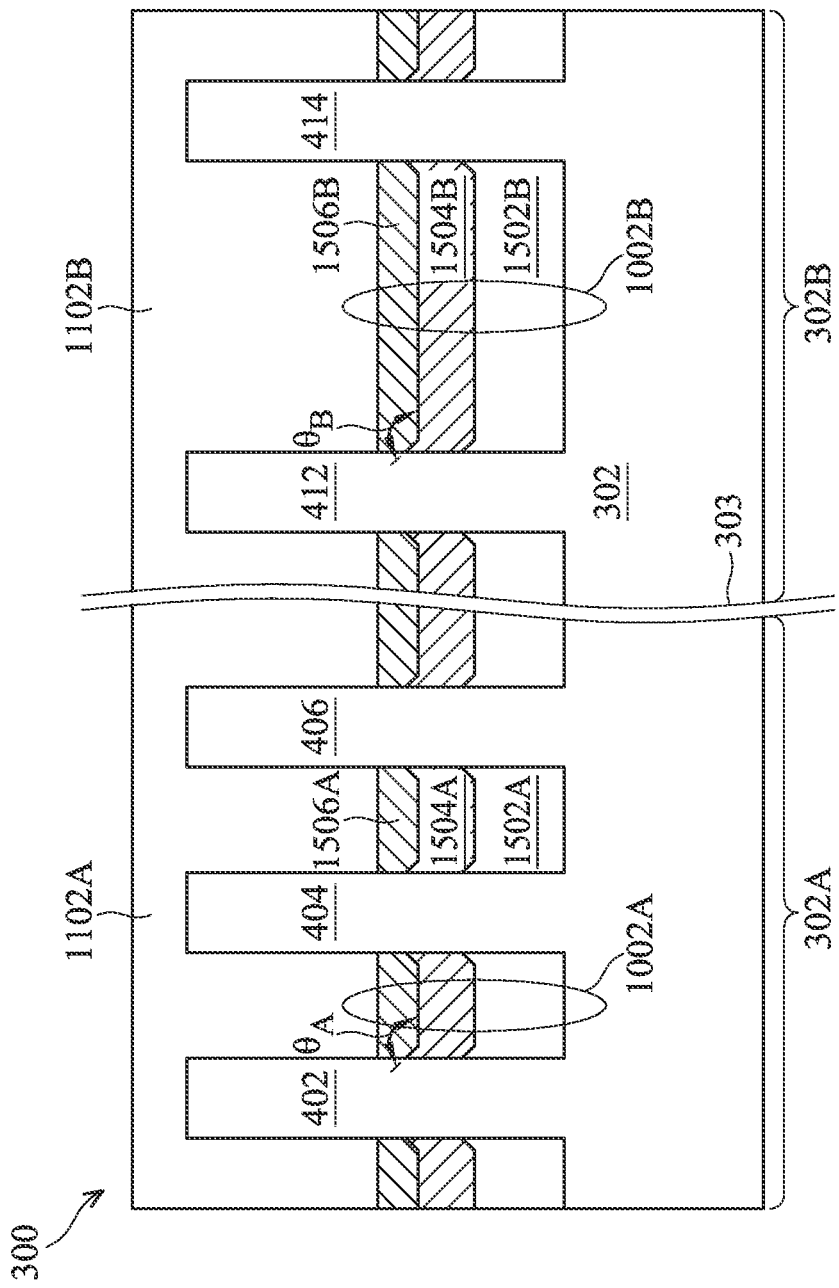

In some other embodiments, when recessing an insulation layer, the top surface may present a curvature-based profile (e.g., a concave surface, a convex surface, or combinations thereof). For example, the STI structures 1002A-B shown in FIG. 15B present at least one of a curvature-based intermediate surface at an interface between the first and second flowable insulation layers, or a curvature-based intermediate surface at an interface between the second and third flowable insulation layers. Such a curvature-based intermediate interface can be characterized with one or more non-right angles. For example, angles, $\theta_A$ and $\theta_B$, exist between a relatively flat middle portion and a relatively curved (or otherwise bent) end portion of the interface between the insulation layers 1504A and 1506A, and between the insulation layers 1404B and 1406B. The angles $\theta_A$ and $\theta_B$ may each be an obtuse angle between about 95 degrees and about 140 degrees. The curvature-based intermediate interfaces may be formed during the recessing of the first flowable insulation layers 1502A-B and/or the second flowable insulation layers 1504A-B.

Figure 16:
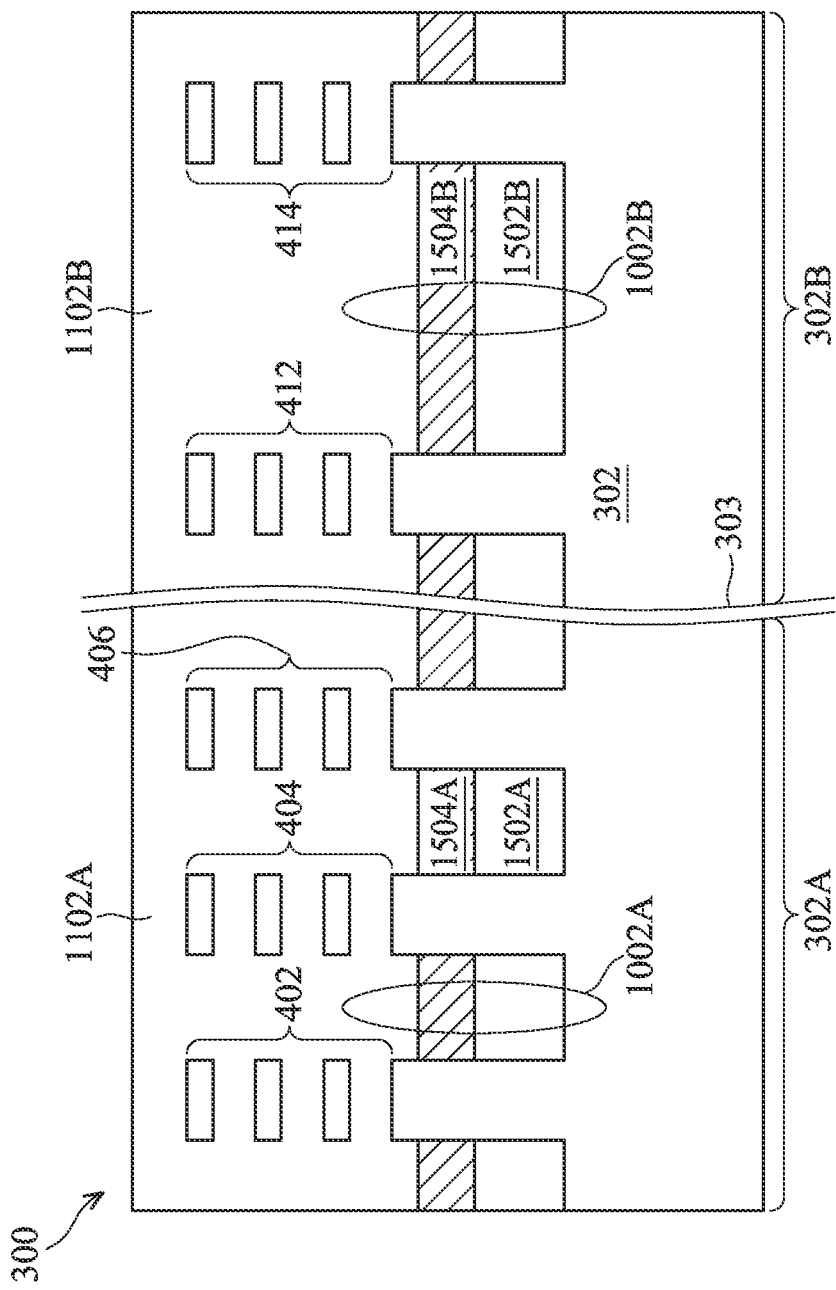
FIG. 16 illustrates a cross-sectional views of an example gate-all-around (GAA) FET device, in accordance with some other embodiments.

FIG. 16 illustrates a cross-sectional view of the transistor device 300 where each of the semiconductor fin structures (channels) 402 to 406 and 412 to 414 includes a number of semiconductor layers, in some embodiments. The cross-sectional view of the transistor device 300 in FIG. 16 is cut along the lengthwise direction of a gate structure, e.g., cross-section A-A (as indicated in FIG. 1).

Such semiconductor layers may be vertically separated with each other, and each of the semiconductor layers may be wrapped around by an active gate structure. As shown, the active gate structure 1102A can wrap around each of the semiconductor layers of the fin structure 402, each of the semiconductor layers of the fin structure 404, and each of the semiconductor layers of the fin structure 406; and the active gate structure 1102B can wrap around each of the semiconductor layers of the fin structure 412 and each of the semiconductor layers of the fin structure 414. The cross-sectional view of FIG. 16 illustrates the transistor device 300 that includes the STI structures 1002A-B shown in FIG. 11, but it should be appreciated that the transistor device 300 (with it channel having one or more vertically separated semiconductor layers) can include other embodiments of the STI structures as shown in FIGS. 12A-15B, while remaining within the scope of present disclosure.

In one aspect of the present disclosure, a semiconductor device is disclosed. The semiconductor device includes a substrate including a first area and a second area. The semiconductor device in the first area includes: a plurality of first non-planar semiconductor structures, wherein the first non-planar semiconductor structures, parallel with one another, are separated with a first distance; and a first isolation region comprising a first layer and a second layer that collectively embed a lower portion of each of the first non-planar semiconductor structures, wherein at least one of the first layer or second layer is in a cured state. The semiconductor device in the second area includes: a plurality of second non-planar semiconductor structures, wherein the second non-planar semiconductor structures, parallel with one another, are separated with a second distance; and a second isolation region comprising a first layer and a second layer that collectively embed a lower portion of each of the second non-planar semiconductor structures, wherein at least one of the first or second layer is in a cured state.

In another aspect of the present disclosure, a method for making a semiconductor device is disclosed. The method includes forming a plurality of fin structures over a substrate. The method includes filling trenches between adjacent one of the fin structures with a first insulation material. The method includes recessing the first insulation material. The method includes densifying at least an upper portion of the first insulation material. The method includes filling the trenches with a second insulation material. The method includes densifying the second insulation material, thereby causing the densified second insulation material to be in contact with the densified upper portion of the first insulation material. The method includes removing at least a portion of the densified second insulation material to form a shallow trench isolation between the adjacent fin structures.

In yet another aspect of the present disclosure, a method for making a semiconductor device is disclosed. The method includes forming a plurality of first fin structures and a plurality of second fin structures over respective areas of a substrate. The method includes filling trenches between the first fin structures and trenches between the second fin structures with a first insulation material, respectively. The method includes recessing the first insulation material disposed in the trenches between the first fin structures and the first insulation material disposed in the trenches between the second fin structures, respectively. The method includes curing an upper portion of the recessed first insulation material disposed in the trenches between the first fin structures and an upper portion of the recessed first insulation material disposed in the trenches between the second fin structures, respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for making semiconductor devices, comprising:
   forming a plurality of fin structures over a first area of a substrate;
   filling trenches between adjacent one of the fin structures with a first insulation material;
   recessing the first insulation material;
   densifying at least an upper portion of the first insulation material;
   filling the trenches with a second insulation material;
   densifying the second insulation material, thereby causing the densified second insulation material to be in contact with the densified upper portion of the first insulation material; and
   removing at least a portion of the densified second insulation material to form a shallow trench isolation between the adjacent fin structures.

2. The method of claim 1, wherein each of the first and second insulation materials includes a flowable insulation material.

3. The method of claim 1, wherein the step of densifying at least an upper portion of the first insulation material and the step of densifying the second insulation material comprise performing a curing process on the first insulation material and the second insulation material, respectively.

4. The method of claim 3, wherein the curing process including at least one of: a radiation cure process, an oxidation cure process, a nitridization cure process, a thermal cure process, an electron beam cure process, an ion beam cure process, a plasma cure process, or a microwave cure process.

5. The method of claim 1, wherein the step of densifying at least an upper portion of the first insulation material further comprises densifying the whole of the first insulation material.

6. The method of claim 5, wherein an curvature-based interface is present between the densified first insulation material and a remaining portion of the second insulation material.

7. The method of claim 1, wherein the step of removing at least a portion of the densified second insulation material further comprises removing the whole of the densified second insulation material and an upper portion of the densified first insulation material.

8. A method for making semiconductor devices, comprising:
   forming a plurality of first fin structures and a plurality of second fin structures over respective areas of a substrate;
   filling trenches between the first fin structures and trenches between the second fin structures with a first insulation material, respectively;
   recessing the first insulation material disposed in the trenches between the first fin structures and the first insulation material disposed in the trenches between the second fin structures, respectively; and
   curing an upper portion of the recessed first insulation material disposed in the trenches between the first fin structures and an upper portion of the recessed first insulation material disposed in the trenches between the second fin structures, respectively.

9. The method of claim 8, further comprising:
   filling the trenches between the first fin structures and the trenches between the second fin structures with a second insulation material, respectively; and
   curing the second insulation material disposed in the trenches between the first fin structures and the second insulation material disposed in the trenches between the second fin structures, respectively.

10. The method of claim 9, further comprising:
    recessing at least one of the first or second cured insulation material disposed in the trenches between the first fin structures and at least one of the first or second cured insulation material disposed in the trenches between the second fin structures, so as to expose an upper portion of each of the first fin structures and an upper portion of each of the second fin structures, respectively.

11. The method of claim 9, wherein each of the first and second insulation materials includes a flowable insulation material.

12. The method of claim 8, wherein the first fin structures are separated from one another with a first distance and the second fin structures are separated from one another with a second distance, and wherein the first distance is different from the second distance.

13. The method of claim 12, wherein the first distance is less than the second distance.

14. The method of claim 12, wherein the upper portion of each of the first fin structures has a first height and the upper portion of each of the second fin structures has a second height, and wherein the first height is equal to the second height.

15. A method for making semiconductor devices, comprising:
    forming a plurality of first non-planar semiconductor structures in a first area of a substrate, wherein the first non-planar semiconductor structures, parallel with one another, are separated with a first distance;
    forming a plurality of second non-planar semiconductor structures in a second area of the substrate, wherein the second non-planar semiconductor structures, parallel with one another, are separated with a second distance;
    filling first trenches between the first non-planar semiconductor structures and second trenches between the second non-planar semiconductor structures with a first insulation material, respectively;
    recessing the first insulation material disposed in the first trenches and the first insulation material disposed in the second trenches, respectively; and
    curing an upper portion of the recessed first insulation material disposed in the first trenches and an upper portion of the recessed first insulation material disposed in the second trenches, respectively.

16. The method of claim 15, wherein the first distance is less than the second distance.

17. The method of claim 16, wherein a first height of a non-embedded, upper portion of each of the first non-planar semiconductor structures is equal to a second height of a non-embedded, upper portion of each of the second non-planar semiconductor structures.

18. The method of claim 15, wherein each of the first non-planar semiconductor structures comprises a plurality of first channel layers vertically separated from one another, and each of the second non-planar semiconductor structures comprises a plurality of second channel layers vertically separated from one another.

19. The method of claim 15, further comprising:
    filling the first trenches and the second trenches with a second insulation material, respectively;

curing the second insulation material disposed in the first trenches and the second insulation material disposed in the second trenches, respectively; and recessing at least one of the first or second cured insulation material disposed in the first trenches and at least one of the first or second cured insulation material disposed in the second trenches, so as to expose an upper portion of each of the first non-planar semiconductor structures and an upper portion of each of the second non-planar semiconductor structures, respectively.

20. The method of claim 19, wherein each of the first and second insulation materials includes a flowable insulation material.

* * * * *